(12) United States Patent
Noji et al.

(10) Patent No.: US 6,332,925 B1
(45) Date of Patent: Dec. 25, 2001

(54) EVACUATION SYSTEM

(75) Inventors: Nobuharu Noji, Fujisawa; Yasuhiro Niimura, Ayase; Hiroaki Ogamino, Kawasaki; Hiroshi Hattori, Yokohama; Norihiko Nomura; Tetsuro Sugiura, both of Fujisawa; Yuji Matsuoka, Kakamigahara, all of (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 08/861,007

(22) Filed: May 21, 1997

(30) Foreign Application Priority Data

| May 23, 1996 | (JP) | ................................................ 8-151589 |
| May 23, 1996 | (JP) | ................................................ 8-151590 |
| Dec. 16, 1996 | (JP) | ................................................ 8-353174 |

(51) Int. Cl.$^7$ .............................. C23C 16/00; B01D 8/00; B01D 53/00
(52) U.S. Cl. ...................... 118/715; 156/345; 55/315.2; 55/342.2; 62/55.5
(58) Field of Search .............. 118/715; 156/345; 55/315.2, 342.2; 62/55.5

(56) References Cited

U.S. PATENT DOCUMENTS

| 3,719,052 | 3/1973 | White ........................................ 62/3 |
| 4,541,249 | 9/1985 | Graves et al. . |
| 4,551,197 | 11/1985 | Guilmette et al. . |
| 4,835,974 | 6/1989 | Spahn . |
| 4,966,016 | * 10/1990 | Bartlett .................................. 62/55.5 |
| 5,250,092 | * 10/1993 | Nakano ................................... 96/136 |
| 5,928,426 | * 7/1999 | Aitchison .............................. 118/715 |

FOREIGN PATENT DOCUMENTS

| 44 38 874 | 5/1996 | (DE) . |
| 0 665 305 A1 | 8/1985 | (EP) . |
| 0 477 813 A1 | 4/1992 | (EP) . |
| 2 523 113 | 9/1983 | (FR) . |
| 2523113 | * 9/1983 | (FR) . |
| 53-29237 | 3/1978 | (JP) . |
| 58-106186 | 6/1983 | (JP) . |
| 60-156983 | 8/1985 | (JP) . |
| 63-287524 | 11/1988 | (JP) . |
| 2-170981 | * 7/1990 | (JP) ...................................... 118/715 |

OTHER PUBLICATIONS

Patent Abstracts of Japan, vol. 015, No. 150 (C–0824), Apr. 16, 1991 and JP 03–028377.

O'Hanlon, A Users Guide to Vacuum Technology, $2^{nd}$ Ed. John Wiley and Sons, NY, © 1989, pp. 252–272 and 371–379.*

* cited by examiner

*Primary Examiner*—Richard Bueker
(74) *Attorney, Agent, or Firm*—Armstrong, Westerman, Hattori, McLeland & Naughton, LLP

(57) ABSTRACT

An evacuation system having a long service life, a compact configuration and high reliability is disclosed. The system enables the process gases to be reused, so that the overall costs of capital investment and operation are reduced. The system comprises a processing chamber, and a vacuum pump communicating with the processing chamber by way of an evacuation conduit for evacuating the processing chamber. The evacuation conduit are provided with not less than two trapping devices arranged in series and operating at different temperatures for capturing different components contained in an exhaust gas discharged from the processing chamber.

38 Claims, 21 Drawing Sheets

F I G. 18A
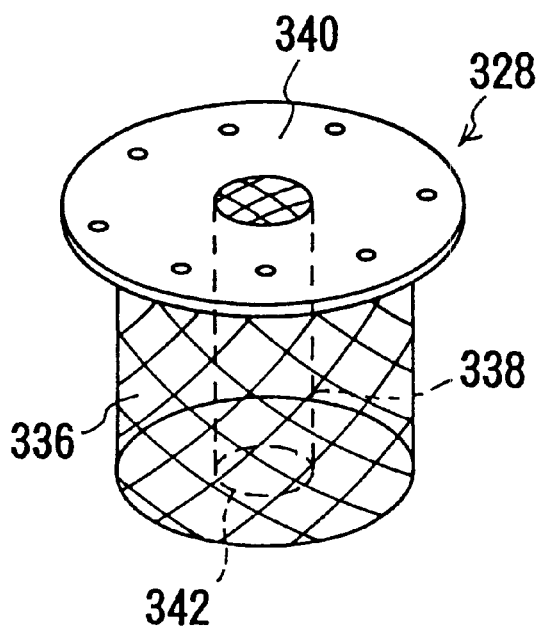
F I G. 18B
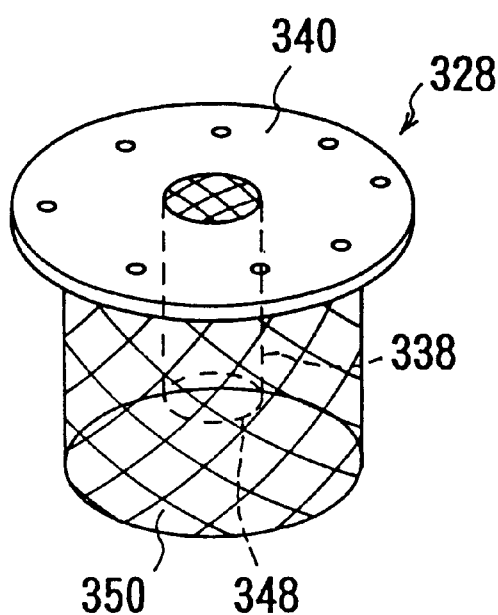
F I G. 18C
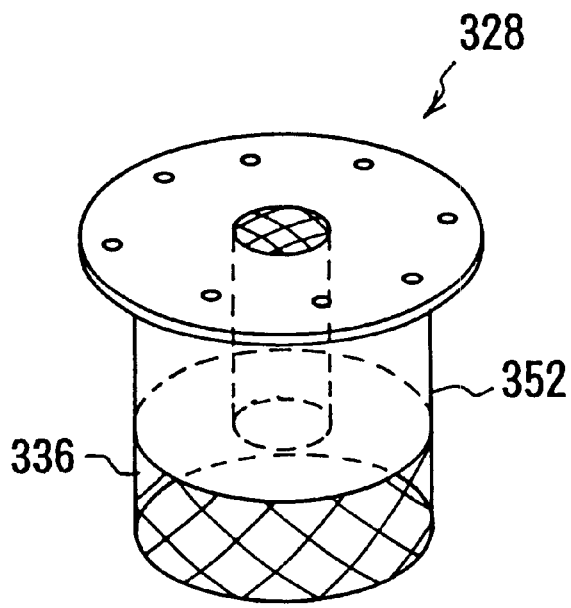

F I G. 20A
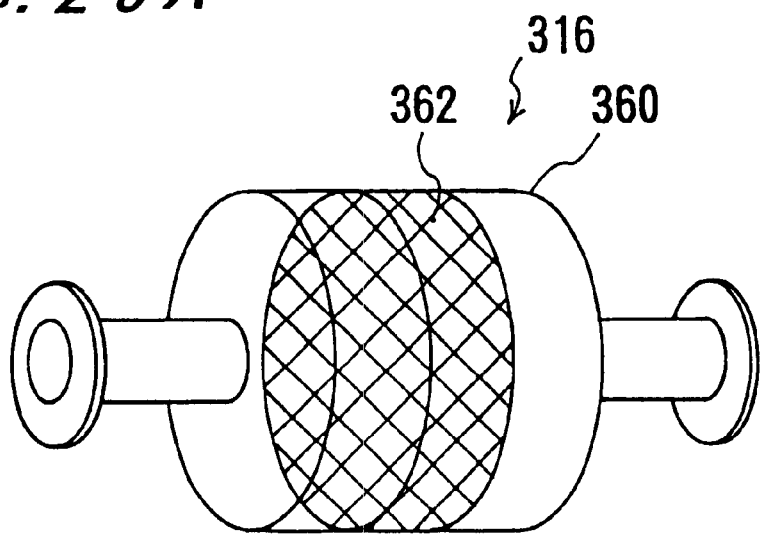
F I G. 20B
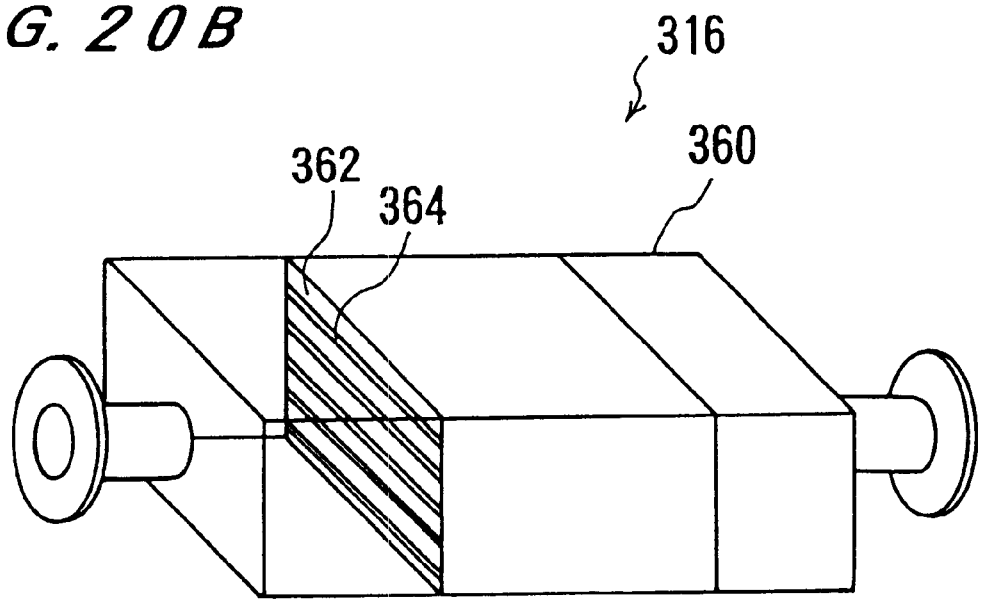

EVACUATION SYSTEM

BACKGROUND OF THE INVENTION

1. Field of the Invention

The present invention relates to an evacuation system used in, for example, evacuating a processing chamber of a semiconductor fabrication apparatus.

2. Description of the Related Art

A conventional evacuation system will be explained with reference to FIG. 23. A vacuum chamber 410 is, for example, a processing chamber in a semiconductor fabrication apparatus for performing tasks such as dry etching process or chemical vapor deposition (CVD) process, and is connected to a vacuum pump 412 through an evacuation and exhaust conduit 414. The vacuum pump 412 is used to elevate the pressure of the process gas to an atmospheric pressure so as to evacuate the vacuum chamber 410, and in the past, this role has been served by an oil pump, but lately it has been mainly served by a dry pump. If the degree of vacuum required by the vacuum chamber 410 is higher than that achievable by the dry pump alone, a higher performance vacuum device such as a turbomolecular pump is sometimes used in the upstream side of the dry pump.

The process gas can be toxic or explosive, depending on the nature of the process, and cannot be allowed to escape into the environment without being treated. For this reason, an exhaust gas treatment device 426 is placed downstream of the vacuum pump 412 in which those gaseous components which cannot be released to the environment are treated by being adsorbed, decomposed or absorbed, and only the detoxified gases are released. The evacuation conduit 414 is provided with valves to isolate sections, as necessary.

The conventional arrangement of evacuation systems described above share the following common faults.

1. If the reaction byproducts contain corrosive gases, the vacuum pump may be attacked, thus shortening its service life. For example, when etching silicon-based devices with a typical process gas containing $CF_4$ and $O_2$, its exhaust gas contains $SiF_4$, $F_2$, $CO$, $CO_2$ in addition to the residual $CF_4$ and $O_2$. Of these gases, $F_2$ is particularly strongly corrosive (because fluoride radicals are produced in the process) to the vacuum pump.
2. If the process byproduct contains a gas having a high sublimation temperature, which is exhausted by the vacuum pump, the result is the formation of deposit particles within the vacuum pump to ultimately become a reason for its failure to perform. For example, when etching aluminum-based devices by using a typical process gas containing $BCl_3$, $Cl_2$, the vacuum pump must exhaust a reaction byproduct gas $AlCl_3$, in addition to residual $BCl_3$ and $Cl_2$. This gas, $AlCl_3$, does not decompose in the intake side of the pump because of its low partial pressure, but the partial pressure increases in the pressurized exhaust gas to produce precipitation within the vacuum pump to cause performance problems. Similar problems occur when operating a CVD apparatus, for producing SiN films, that produces byproduct gases $(NH_4)_2SiF_6$ and $NH_4Cl$ and the like.
3. Solid particles may be discharged from the processing chamber, which may enter the vacuum pump directly to cause operational problems. For example, in the case of a reduced pressure CVD apparatus based on tetraethyloxysilane (TEOS) process for producing Si films, the process gas containing TEOS and $O_2$ is used, and various types of alcohols and solid $SiO_2$ particles are produced. The silicon oxide particles are produced as solids in the reaction, and they impart mechanical damage to the vacuum pump.
4. When the byproduct contains a gas which is reactive at high temperatures, it may react within the vacuum pump to cause operational problems. For example, in a CVD apparatus for producing tungsten films using a typical process gas containing $WF_6$ and $SiH_4$, the gaseous byproducts $HF$ and $H_2$ along with residual $WF_6$ and $SiH_4$ gases are exhausted from the processing chamber. As the pressure and temperature within the vacuum pump increase, $WF_6$ and $SiH_4$ react with each other to precipitate W particles that cause operational problems for the vacuum pump.
5. The conventional facilities are expensive to operate because the process gases are discarded without being reused. Especially some gases such as $SiH_4$ are expensive, and it is desirable that they be recycled, however, recycling has not been practiced in the past. Also, in the conventional approach, there are trapped several kinds of gases in one trapping device, and it has been laborious to process the byproducts for separation into various components.
6. The entire voluminous exhaust gas must be processed in the exhaust gas treatment apparatus, which leads to a large-scale operation and a huge capital expenditure, in the first place, and the processing steps become complex and the running cost can be expensive.

Of the various problems listed above, corrosion resistant pumps have been developed to deal with the problems presented in items 1, and the problems outlined in item 2 have been dealt with by raising the operating temperature of the vacuum pump; however, such remedies relate only to the vacuum pump operations, and because the overall system problems have not been addressed, progress has been minimal. There have been no considerations given to the problems outlined in items 5 and 6.

SUMMARY OF THE INVENTION

It is an object of the present invention to provide an evacuation system having a long service life and high reliability, which can also make the exhaust gas treatment device smaller, and the process gases reusable, so that the overall costs of capital investment and operation are reduced.

The object has been achieved in an evacuation system comprising a processing chamber, and a vacuum pump communicating with the processing chamber by way of an evacuation conduit for evacuating the processing chamber, wherein the evacuation conduit are provided with not less than two trapping devices arranged in series and operating at different temperatures for capturing different components contained in an exhaust gas discharged from the processing chamber. Corrosive gases and abrasive components in the exhaust gas are thus removed before they can enter into the vacuum pump to cause damage to the pump. The adoption of at least two different temperatures for the traps enables to separate the exhaust gas having a mixture of component gases into separate components, thus facilitating the ensuing process of gas treatment and conserving expensive process gases for reuse.

The cascading arrangement of thermal traps in a descending temperature gradient, from upstream to downstream traps in the evacuation system, enables solid particles and those gases having high sublimation temperatures to be trapped in the first trap while the other components and reaction byproducts can be trapped in the second and ensuing traps downstream, according to their thermodynamic properties.

The trap temperature varies depending on the type of target gas, and should be set lower than the solidifying temperature of the target components. If the temperature is in a typical range, i.e., not lower than −60° C., the cooling medium can be chosen from such materials as-air, water, brine and organic coolants.

Especially, for those thermal traps following the second trap, the operating temperatures are often not higher than −60° C. In these cases, cooling methods include helium refrigeration device (based on the heat of expansion of helium gas) used in cryogenic pumps typically represented by GM refrigeration device. More preferably, a pulse tube refrigeration device is used to minimize vibration.

When the trap temperature is close to or higher than the vaporization temperature of the liquefied gas, it is convenient to utilize the latent heat of vaporization. Especially, liquid nitrogen is attractive because of its availability and low cost. If not less than two low-temperature traps are needed, helium refrigeration unit can be used in conjunction with a liquid nitrogen unit.

Trapping performance changes depending on the operating temperature of the low-temperature trap, therefore, a temperature sensor may be provided in conjunction with a heater and a controller to maintain a constant temperature in the trap.

From the standpoint of ease of treating gaseous components for reuse, the trapped gases should be essentially free of impurities, and for this reason, descending temperatures in a series cascading arrangement of traps is preferable.

The operating temperatures of the various low-temperature traps should be separated by a pre-determined amount, for example, in a vicinity of −60° C., the difference should be not less than 40° C., and in a vicinity of −200° C., it should be not less than 20° C. By adopting such a scheme, it is possible to separate the gases into precise groups.

When the target gas does not solidify except at extremely low temperatures or when it is desired to trap a certain gas, it is effective to use adsorption agent on the surface of the low-temperature trap. Such agents include zeolite, activated charcoal, alumina, silica gel and metal oxides.

When the accumulated solid material or solidified gas reaches a certain level in a trap, the trap must be regenerated. The need for replacing of a trap can be indicated by a sensor, for example, by measuring a differential pressure between fore- and aft-locations of the trap. When a threshold value is exceeded, it may be an indication of the limit of the trap capacity so that the trap should be regenerated.

For regeneration purposes, if it is difficult to process the trap in-situ, because of solid particles accumulated therein, for example, an entire new trap may be substituted for the used trap. For this purpose, the trap may be attached to the conduit with a flange, for example, so that it may be readily detached from the system. For isolating the trap while detaching from the system, shut-off valves or self-closing valves may be utilized.

The target gas trapped at relatively higher temperatures are time-consuming to recover at room temperature, and in such cases, it is desirable to provide a heater inside the trap. Those gases trapped at relatively lower temperatures can be regenerated quickly at room temperature, and require no heater. In such cases, a gas inlet port to admit a gas at room temperature facilitates regeneration of the target gas, and if the gas is explosive in nature, an inert gas such as nitrogen can be used to dilute the gas.

When the regenerated gases are to be reused, an inert gas cannot be introduced into the trap, thus necessitating the trapped gas to be released gradually. In such cases, it is necessary to gradually adjust the cooling process of the refrigeration unit or liquid gas so as to gradually raise the temperature of the trap.

During such a regeneration operation, the trap must be detached from the system or the fore- and aft-valves of the trap must be shut off, thus disabling the vacuum function. Therefore, to continue the regeneration process without shutting down the evacuation process, at least two groups of a parallel arrangement of traps should be inserted into the evacuation system so that the evacuation path may be switched from one group to another group of traps.

The trapping devices may comprise a switching device for mechanically switching at least one of the trapping devices between the regeneration conduit and the evacuation conduit. In this case, the trapping devices may comprise two trapping members alternatingly placed in the regeneration conduit and the evacuation conduit so as to enable a simultaneous processing of trap and regeneration. This construction makes it unnecessary to stop the apparatus for conducting regeneration process even in a long time operation, or to prepare substitute trapping members. It also makes it easier to automize the whole process by using an appropriate timing judgement device.

If the regenerated gas can be reused, it can be treated through a refining apparatus before it is returned to the processing chamber. If the regenerated gas requires cleansing before being discarded, it is sent to a treatment apparatus.

If the regenerated gas cannot be treated immediately or if there is no cleansing apparatus, the trapped gas is sent to a storage tank maintained at about the same temperature, so that it can be re-solidified and stored for later processing. The stored gas can be reused or the tank can be moved to a suitable processing site.

The traps presented above are based on a thermal capturing principle. However, the efficiency of the whole evacuation system can be further improved by combining such thermal traps with other types of traps. For example, residual gases can be reacted or decomposed, and the corrosive process gas such as $F_2$ radicals can be reacted with a sacrificial material, such as carbon, before entering the traps.

The present invention is embodied in another type of an evacuation system based on reactive traps. This object has been achieved in a system comprising a processing chamber and a vacuum pump communicated with an exhaust conduit having a reactive trap for reacting with a target component of the exhaust gas so as to deactivate the target component.

Accordingly, an active component contained in the exhaust gas is reacted with the sacrificial material before it is allowed to enter into the vacuum pump, and is converted into an inactive material, so that the vacuum pump is protected from corrosion or blockage within the pump caused by the active component reacting with other components in the vacuum pump.

The sacrificial material may be fabricated into suitable shapes so as to provide ample flow of gases. Such a trap is placed upstream of the vacuum pump, and because the gas velocity is high, it is necessary to provide good flow-through properties in the trap.

In some case, it may be necessary to provide a filtering device between the sacrificial material and the vacuum pump to remove solid byproducts formed by the reaction of sacrificial material with some specific substance in the exhaust gas. By adopting such an arrangement, the vacuum pump can be maintained in a top performance condition, by removing and preventing any harmful products from reaching the vacuum pump.

The filtering device may be formed as a low-temperature trap, in which high solidification temperature components are trapped through solidification and are removed.

The vacuum pump may be formed as a dry pump which uses no lubricating oil in an exhaust path. Since, in this type of pumps, the surfaces of the assembly members along the exhaust path are not covered by lubricating oil and are exposed to the evacuated gas, and accordingly are sensitive to the corrosive components included in the evacuated gas.

The reactive trapping device may be detachably disposed in a path of the exhaust passage so as to make the trapping device exchange operation easier or to enable the sacrifice material supply operation to be done while the trapping device is disassembled.

The reactive trapping device may be disposed in a dual parallel arrangement so as to be selectively communicable with the evacuation conduit, so that the trapping device exchange operation or the sacrifice material supply operation can be done without stopping the evacuation system.

The reactive trapping device may comprise a sensor to indicate an amount of sacrificial material remaining such as a sensor to indicate a differential pressure between fore- and aft-locations of the reactive trapping device. This makes it easier to automize the whole process.

The sacrificial material may include not less than one material selected from a group consisting of C, Si and S.

The sacrificial material may also include a metallic material.

BRIEF DESCRIPTION OF THE DRAWINGS

FIGS. 18A–C are perspective views of the various configurations of sacrificial material containers.

FIGS. 20A and 20B are still another configurations of the reactive trap.

DESCRIPTION OF THE PREFERRED EMBODIMENTS

In the following, preferred embodiments of the two type of evacuation systems and various arrangement of the trapping devices in the system will be presented with reference to the drawings.

Figure 1:
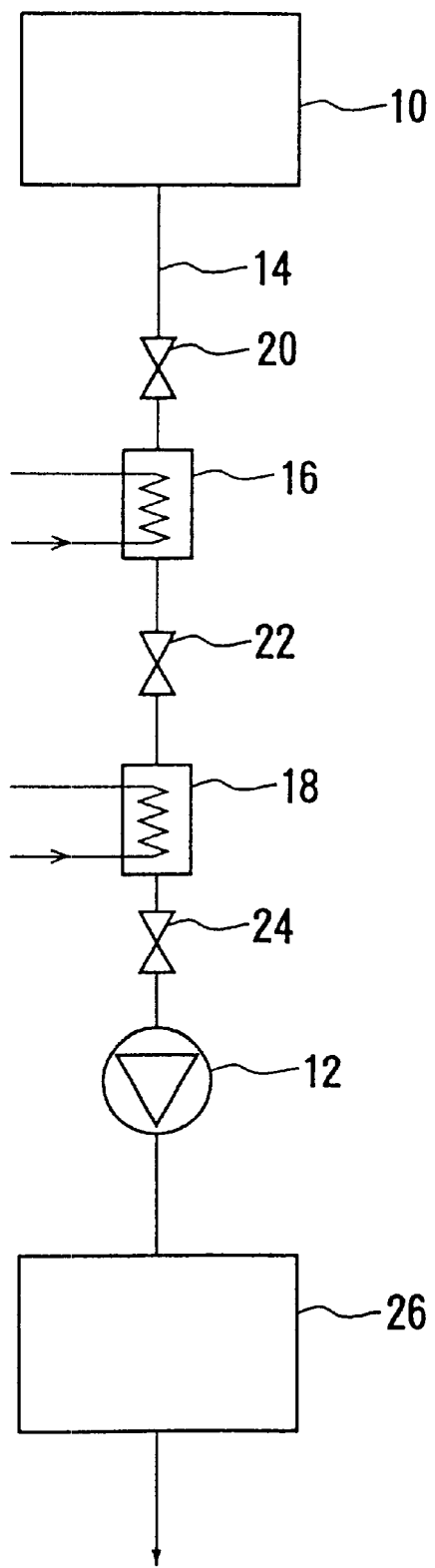
FIG. 1 is a schematic representation of an embodiment of the evacuation system according to the present invention.

FIG. 1 is a schematic representation of a first embodiment of the evacuation system of the present invention, in which a vacuum chamber 10 and a vacuum pump 12 are connected through an evacuation conduit 14 in a series arrangement with two trapping devices 16, 18 operated at different temperatures through valves 20, 22 and 24. Downstream of the vacuum pump 12, there is an exhaust gas treatment device 26.

Figure 2:
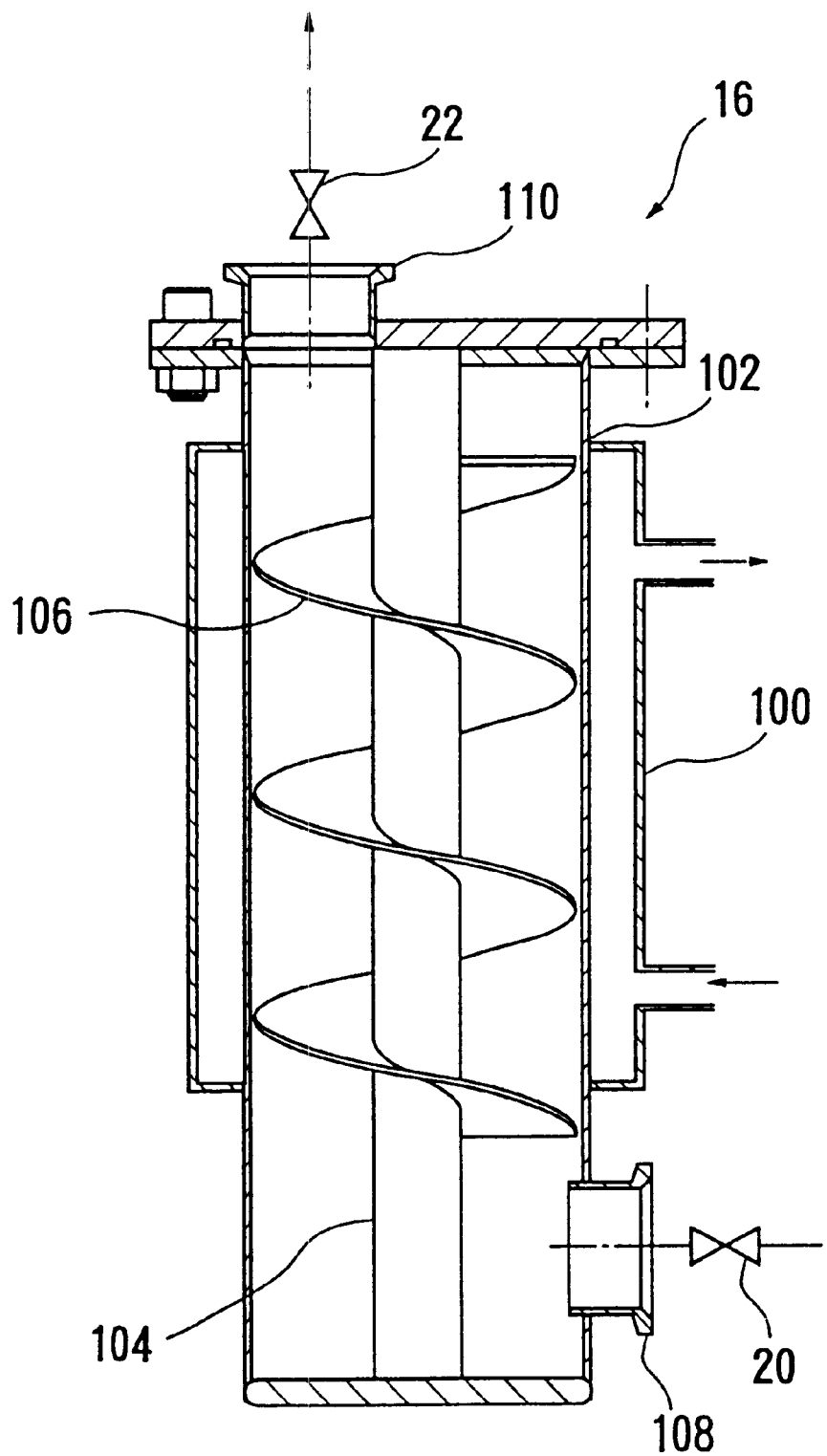
FIG. 2 is a drawing to show the construction of a thermal trap.

The first trapping device 16 is operated at a relatively high temperature, and as shown in FIG. 2, comprises a cylindrical casing 102, for example, having a cooling jacket 100 mounted on the outer periphery of the casing 102 for flowing a cooling medium therethrough, and a baffle plate 106 spirally formed about the central axis 104 of the casing 102 for defining a gas passage extending from the lower entry port 108 to the upper exit port 110. The trapping device 16 is made of a material of good thermal conductivity, such as metals, and the upper lid is detachably attached with a flange to the casing 102.

Figure 3:
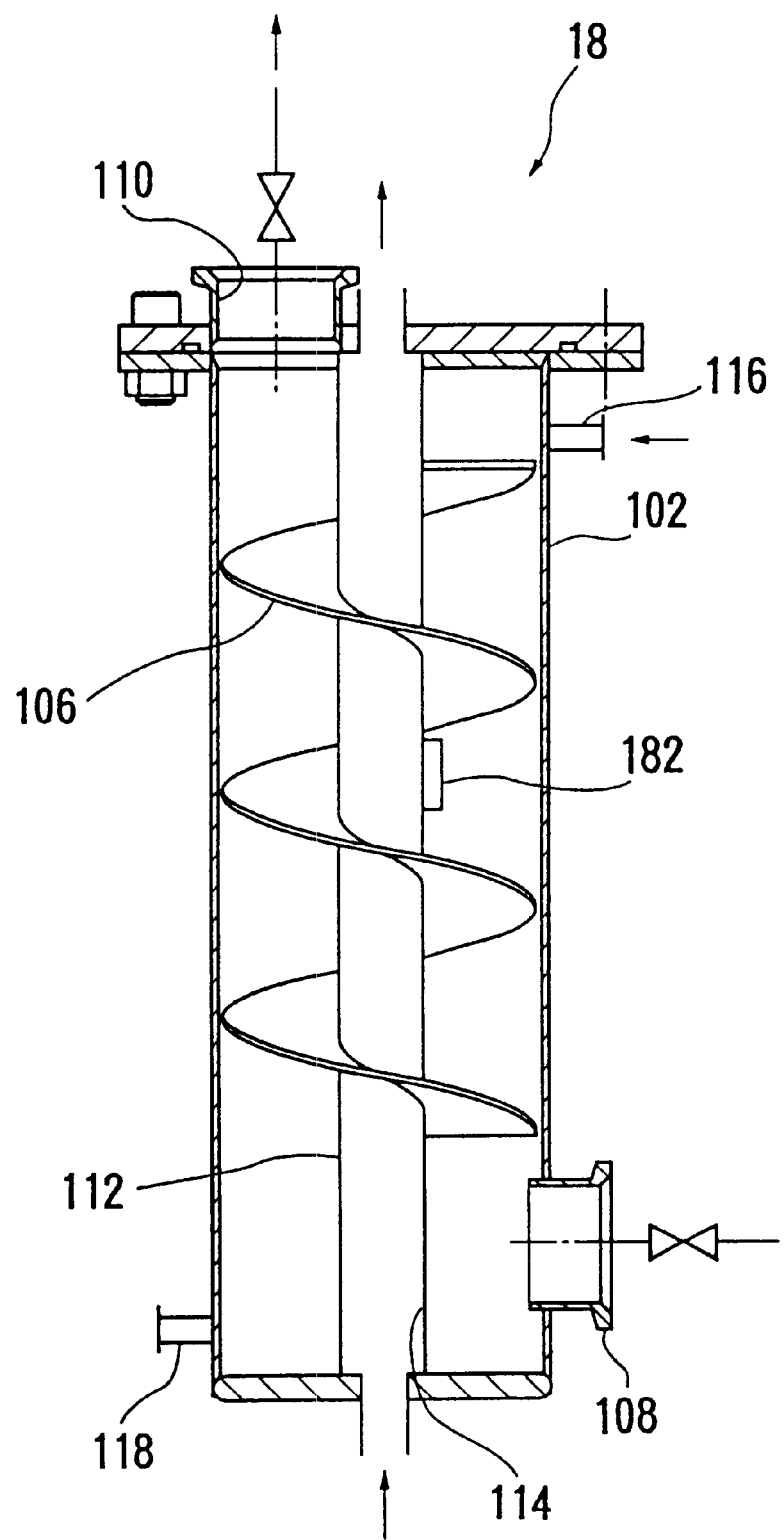
FIG. 3 is another example of the thermal trap.

A second trapping device 18 operates at a much lower temperature, for example, at not higher than −60° C., and has a similar construction to the first trapping device having a casing 102 which houses a baffle plate 106, as shown in FIG. 3, but it is provided with a hollow shaft 112 having a passage 114 for flowing a refrigerant such as liquid nitrogen. In this example, the casing is provided with, in addition to a lower entry port 108 and an upper exit 110, a regeneration medium entry port 116 for the regeneration gas medium (such as nitrogen, which would not react with the regenerated process gas) and regenerated gas exit port 118 for outflow of the regenerated gas. A heater 182 for facilitating the regeneration is provided on the hollow shaft 112.

A description will be presented to explain the process of aluminum etching using the evacuation system. With a typical process gas comprising $BCl_3$ and $Cl_2$, the vacuum chamber exhaust gas is a mixture of gases $BCl_3$, $Cl_2$ and $AlCl_3$. The solidifying temperatures of these gases are as follows:

| Gas Type | $BCl_3$ | $Cl_2$ | $AlCl_3$ |
|---|---|---|---|
| Solid T (° C.) | −107 | −101 | 180 |
| Boiling T (° C.) | 12.5 | −34.0 | — |

The exhaust gas exiting the vacuum chamber 10 enters the first trapping device 16 through the conduit 14 and valve 20. The first trapping device 16 is cooled with the cooling medium, such as water, refrigerant, air or brine, flowing through the cooling jacket 100, and traps only $AlCl_3$ through condensation. Because the solidifying temperature of $AlCl_3$ is 180° C., it is not necessary to flow a refrigerant through the cooling jacket 100, however, it is desirable to operate it at a lower temperature for getting a higher trapping efficiency.

However, because it is not desired to trap $BCl_3$ and $Cl_2$, the cooling temperature must be higher than the dew point temperature at their partial pressures within the trapping device 16. Accordingly, the exhaust gas from the trapping device 16 is essentially all $BCl_3$ and $Cl_2$ with almost no $AlCl_3$. The exhaust gas then enters the second trapping device 18 through the conduit 14 and valve 22.

The second trapping device 18 is cooled with liquid nitrogen flowing through the hollow shaft 114. The result is that $BCl_3$ and $Cl_2$ are frozen and trapped in the second trapping device 18. Some portions of $BCl_3$ and $Cl_2$ flow through the conduit 14 and valve 24 to reach the vacuum pump 12 to elevate the pressure, and are processed in the exhaust gas treatment device 26 and the remainder gas is discharged into the atmosphere. The capture ratio is determined by the area of cooled surface, partial pressures of $BCl_3$ and $Cl_2$, and exhaust speed and other operational parameters.

After a certain period of operation has been accumulated, regeneration process is commenced. The inside surfaces of the first trapping device 16 need only to be washed by water, and in this case, the process line is shutoff, the fore- and aft-valves of the trapping device are closed, and the upper lid of the flange coupling is detached and washed.

Figure 4:
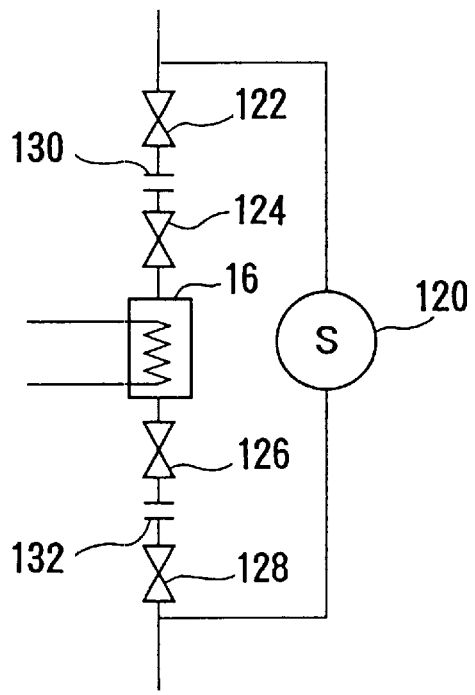
FIG. 4 is a schematic representation of the fore- and aft-trap arrangement having a differential pressure sensor.

FIG. 4 shows conduit arrangement in another embodiment of the trapping device 16. There is a differential pressure sensor 120 to detect the pressure difference between the upstream and downstream locations in the evacuation path. Also, the fore- and aft-conduit are each provided with a pair of valves 122, 124 and 126, 128, as well as flange couplings 130 and 132. As the amount of trapped $AlCl_3$ increases, it is reflected in the differential pressure sensor 120 as the pressure loss in the first trapping device 16. When a pre-determined threshold value is exceeded, regeneration process is started. In this case, valves 122, 124, 126, 128 are closed and the flange couplings 130, 132 are disconnected from the conduit to remove the entire used trapping device 16 and is replaced with a new trapping device 16. By adopting this technique of exchanging the entire trapping device, the process line needs only to be stopped briefly during the exchange process, thus avoiding shutting down the process line for a long period.

Figure 5:
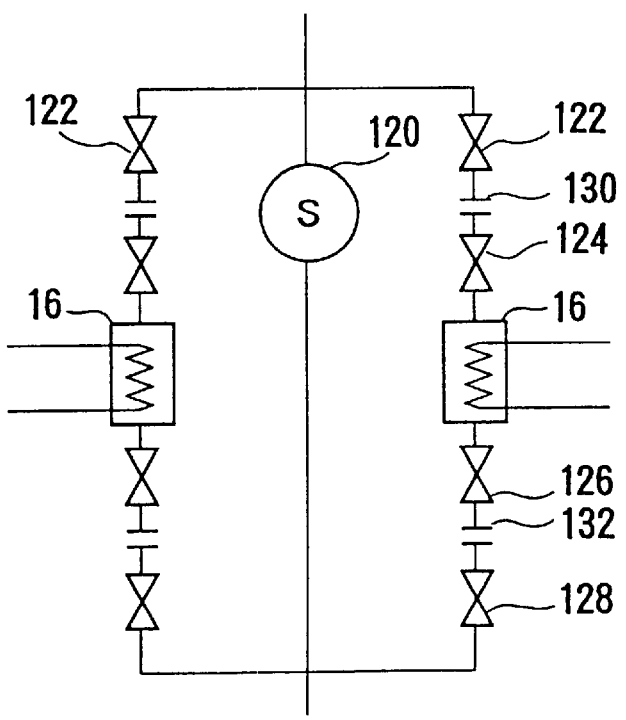
FIG. 5 is a schematic representation of a parallel arrangement of two fore- and aft-traps.

In the above example, a spare trapping device has been prepared beforehand, however, it is possible to provide a parallel arrangement of trapping devices 16, as shown in FIG. 5, to be switched with a valve. In this case, when the differential pressure sensor 120 indicates a high value, the operation is continued by switching the evacuation path while the trapping device 16 in the isolated line is being regenerated or replaced.

Figure 6:
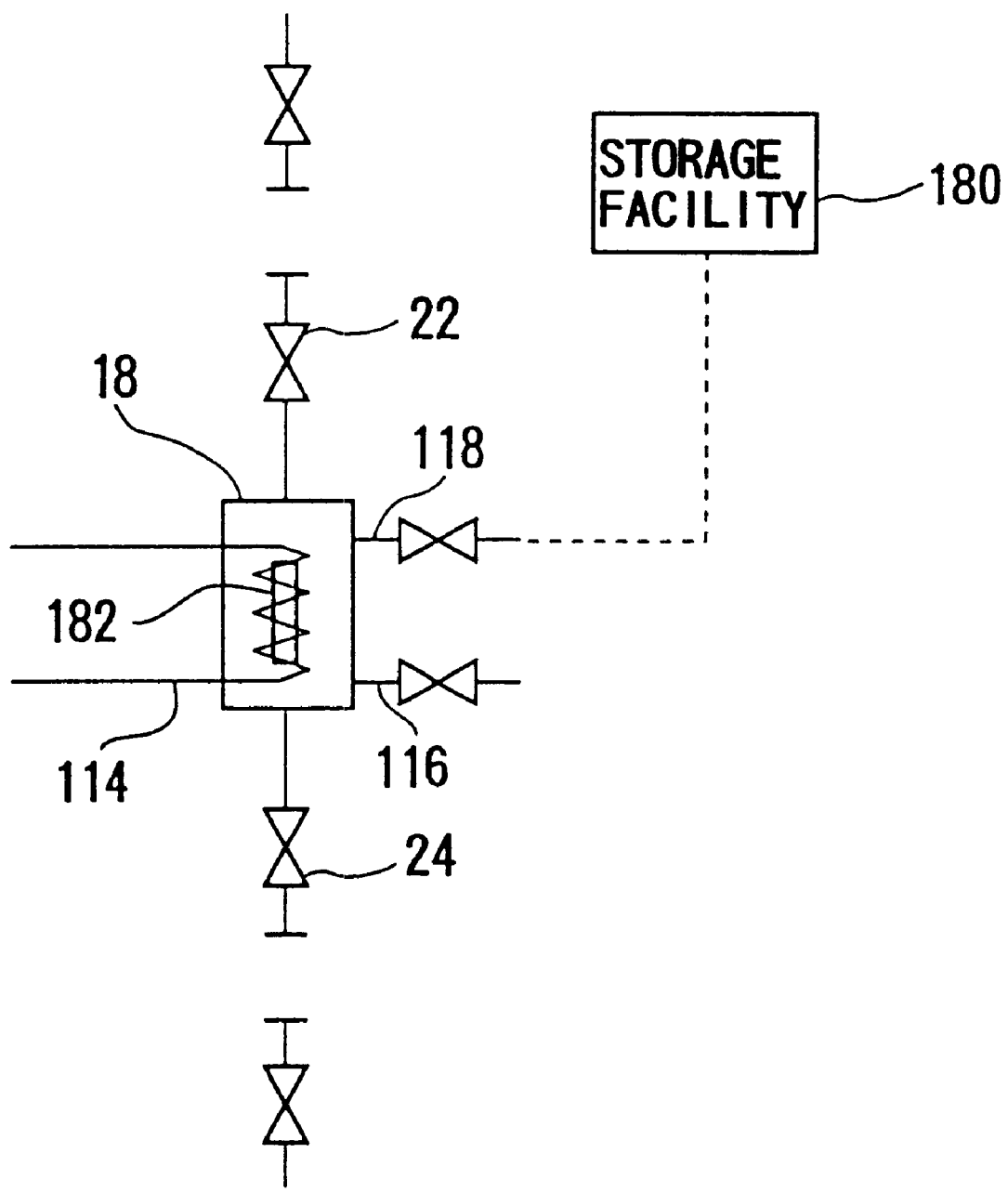
FIG. 6 is a schematic representation of another fore- and aft-trap arrangement having a gas storage unit.

Regeneration of the second trapping device 18 is performed by connecting the exit port with storage facility 180 with conduit, as shown in FIG. 6. Regeneration is performed by closing the valves 22, 24 shown in FIG. 1 or detaching the trapping device from the line as shown in FIG. 6. The second trapping device 18 is provided with a heater 182 so as to enable to heat the baffle plate 106 to vaporize the trapped (frozen solid) $BCl_3$ and $Cl_2$ to exhaust from the exit port 118. Because $BCl_3$ and $Cl_2$ are still highly pure, they can be stored in a storage facility 180 so that they may be reused directly for device processing.

In this case, because the trap temperature is extremely low, regeneration is possible even at room temperature, however, the heater 182 is provided to speed up the regeneration process. Instead of the heater 182, it is possible to introduce a heated regeneration gas, such as inert gas, from the regeneration gas entry port 116.

As described above, by providing trapping devices 16, 18 in the fore-stage of the vacuum pump 12, precipitation-prone gases, such as $AlCl_3$, are reduced from the exhaust gas stream or eliminated, thus preventing precipitation in the dry pump to cause malfunction. Further, because the trapped gases, $BCl_3$ and $Cl_2$, in the trapping devices 16, 18 are reusable, the resources are effectively utilized and the operational cost is reduced. The volume of gas entering the exhaust gas treatment device 26 has been reduced so that the size of the treatment apparatus can be reduced, thus leading to lowering in the capital and operating costs.

Figure 7:
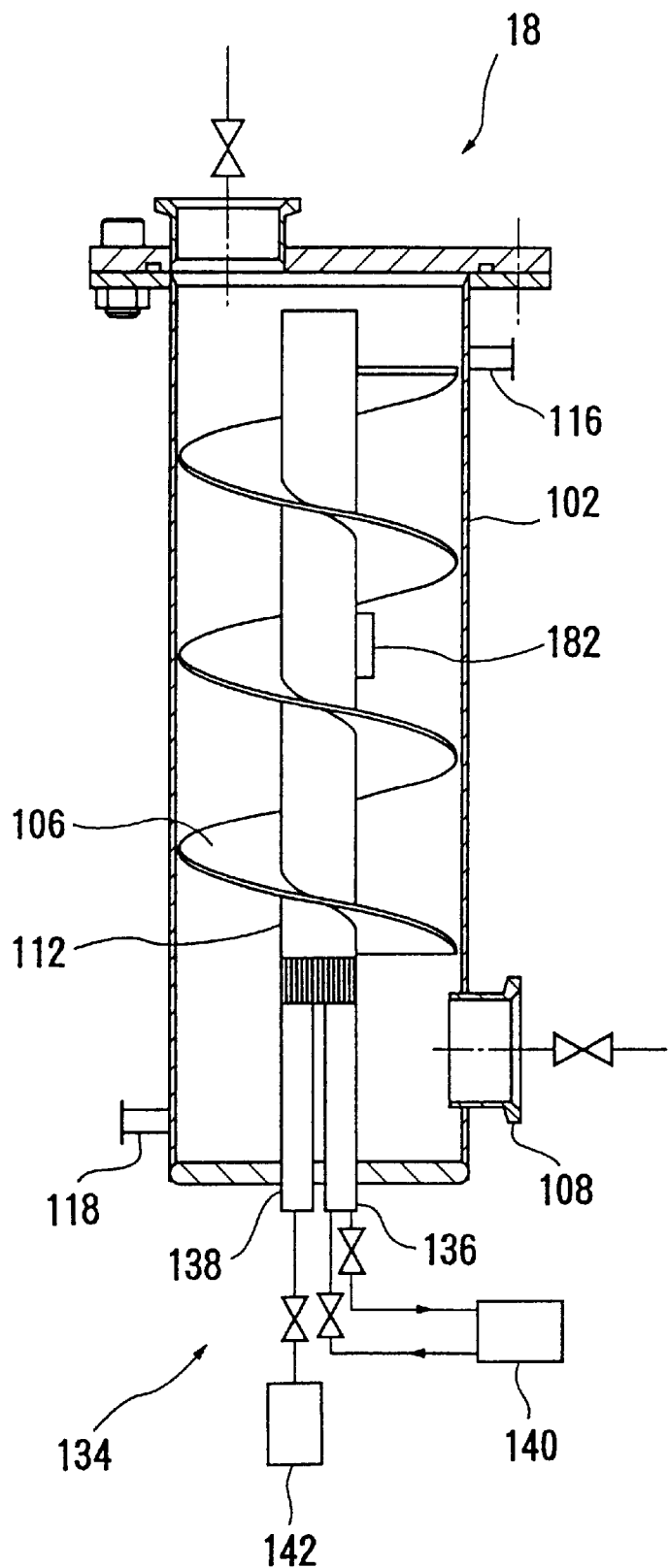
FIG. 7 is a schematic representation of the another thermal trap arrangement.

FIG. 7 shows another example of the low-temperature trapping device, based on a pulse tube refrigeration unit 134, which can be operated at not higher than −60° C. In this device, a regenerater 136 and the pulse tube 138 are adjacently provided in the shaft 112, and the regenerater 136 is connected to a compressor 140 through a conduit and a valve. The pulse tube 138 is connected to a reservoir tank 142. This type of pulse tube refrigeration unit uses the compressor 140 to compress helium gas generally, and obtains cooling effect through the pressure-temperature variance accompanying to compression and expansion cycles to drop the temperature in a range of −60 to −260° C. Regeneration is performed by the heater 182 provided on the baffle plate 106, for example, in conjunction with an inert gas, if it is required to prevent explosion. There is not any expander device in this pulse refrigeration unit 134, as there is in the GM refrigeration units, and consequently, there is not any vibration, and it is possible to heat the unit 134 to high temperatures while stable performance is maintained over a wide range of operating conditions. Furthermore, the GM refrigeration units require annual overhaul maintenance while the maintenance schedule for the pulse tube refrigeration unit can be extended longer.

Figure 8:
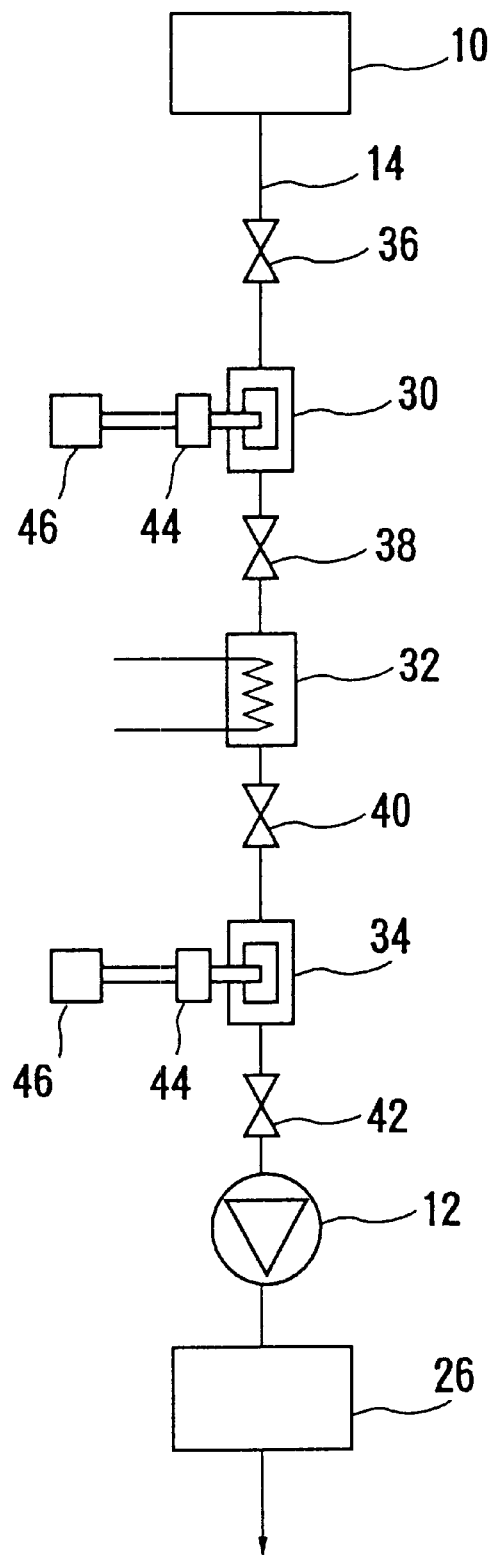
FIG. 8 is a schematic representation of a cascading arrangement of the thermal traps in an evacuation system.

FIG. 8 shows another embodiment of the evacuation system. The conduit 14 connecting the vacuum chamber 10 with the vacuum pump 12 is provided with three trapping devices 30, 32 and 34 operating at respective temperatures connected in series by way of valves 36, 38, 40 and 42. Downstream of the vacuum pump 12, there is an exhaust gas treatment device 26. Of the three trapping devices, the first trapping device 30 and the third trapping device 34 are helium refrigeration units 44, and the second trapping device 32 is a type based on liquid nitrogen cooling presented in FIG. 3. The helium refrigeration unit 44 utilizes the cooling effect through the heat of expansion of compressed helium gas produced by a compressor 46, and can be operated over a wide range of cooling temperatures.

A process of etching silicon device using the evacuation system presented in FIG. 8 will be described below. The process gases used here are $CF_4$ and $O_2$, and the exhaust gas from the vacuum chamber 10 contains $CF_4$, $O_2$, $SiF_4$, $F_2$, CO and $CO_2$.

The properties of these gases are as follows:

| Gas Types | $CF_4$ | $O_2$ | $SiF_4$ | $F_2$ | CO | $CO_2$ |
| --- | --- | --- | --- | --- | --- | --- |
| Solid T (° C.) | −184 | −218 | −80 | −220 | −207 | −57 |
| Boiling T (° C.) | −128 | −183 | −65 | −188 | −192 | −78 |

Therefore, if the first trapping device may be operated at −120° C., for example, to trap $SiF_4$ and $CO_2$, and the second trapping device may be operated at −197° C. to trap $CF_4$, and the third trapping device may be operated at −240° C. to trap CO, $O_2$ and $F_2$. Because the different gases are trapped by the customized trapping devices, the subsequent gas treatment can be carried out separately under conditions appropriate to each gas.

For example, $CF_4$ which is an etching gas can be reused, as necessary, after refining treatment and $F_2$, which is a highly reactive gas, is processed separately to render it harmless. Other harmless gases can be released into the atmosphere. Further, such gas treatment can be performed after accumulating sufficient volume of gas so that the process efficiency can be improved. Additionally, as described above, a large portion of the gas to be treated is trapped before reaching the vacuum pump 12 so that a smaller scale compared with the conventional apparatus is sufficient as the exhaust gas treatment device 26, and therefore, the capital cost can be lowered.

Figure 9:
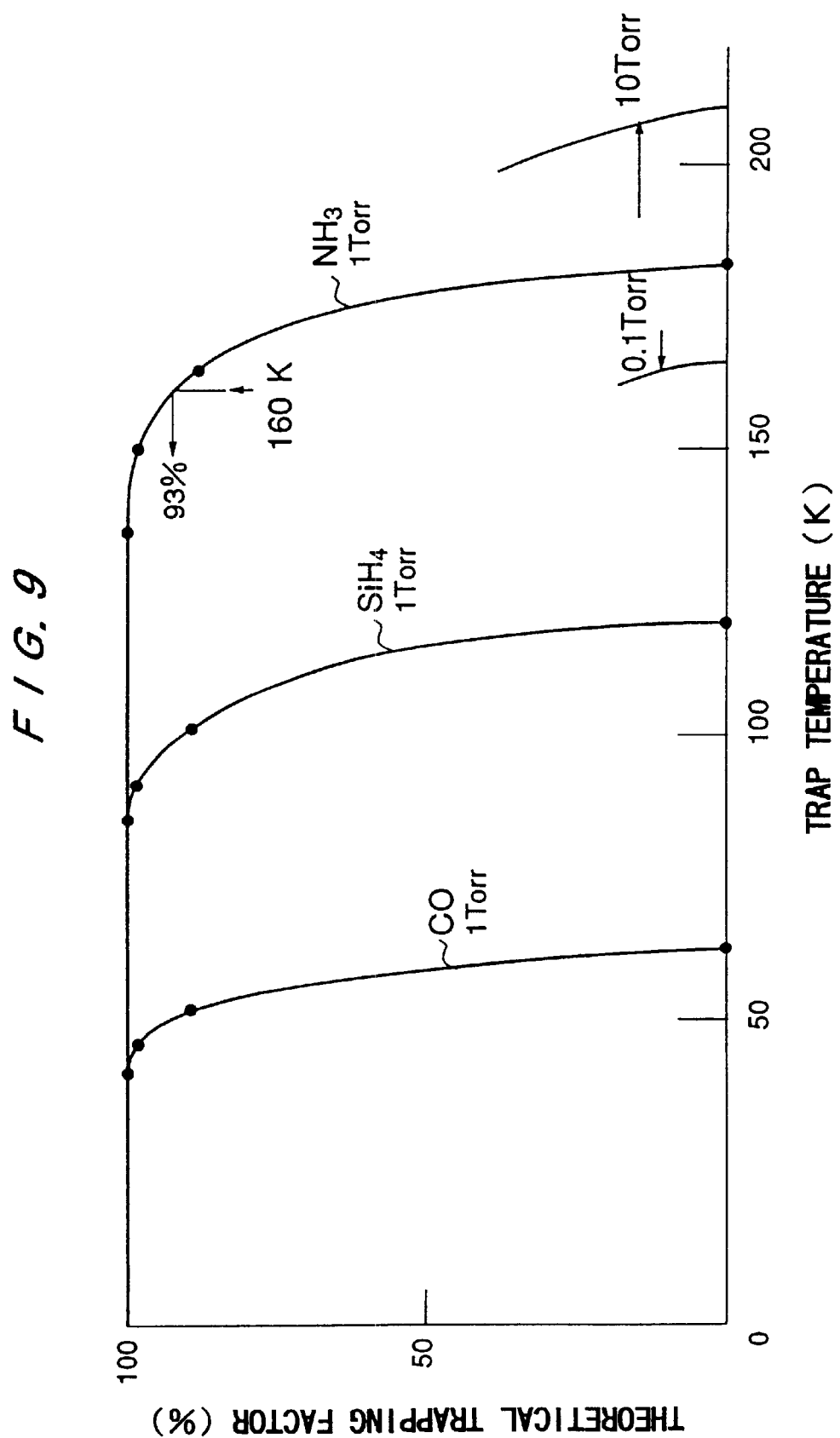
FIG. 9 is a graph showing the principle of trapping byproducts according to thermal trapping principle.

The feature of the present invention is that a plurality of trapping devices operated at different temperatures are used to separate the components in the exhaust gas. The principle of the operation will be explained in the following, with reference to a graph presented in FIG. 9. The horizontal axis of the graph represents the temperature of the trapping devices, and the vertical axis represents the theoretical (ideal) trapping factor. To facilitate understanding of the principle, examples are based on component gases $NH_3$, $SiH_4$ and CO contained in the exhaust gas. In the graph, the three lines represent trapping factors in the case of $NH_3$, $SiH_4$ and CO gases, each having a partial vapor pressure of 1 torr.

For example, the theoretical trapping factor for $NH_3$ at trap temperature 160 K is 93%, and at 130 K, it is over 99.99%. For $SiH_4$, the theoretical trapping factor at 130 K is less than 1%, but at 70 K, it is not less than 99.1%. For CO, the theoretical trapping factor at 70 K is less than 1%, but at 40 K, it is not less than 99.9%. Therefore, when the exhaust gas contains a mixture of $NH_3$, $SiH_4$ and CO, each having 1 torr partial pressure, theoretically, it is possible to separate them roughly by providing three trapping devices maintained at 130, 70 and 40 K.

The above explanation applies to a case of theoretical trapping conditions (i.e., infinitely large trapping area and infinite trapping duration), however, in practice, the area and the duration are finite, and the practical trapping factors are reduced. A practical solution is to lower the trap temperature lower than the theoretical temperature, and also, these examples are based on the partial pressures at 1 torr, but is should be remembered that the curves shift to the right when the partial pressures are higher, and the curves shift to the left when the partial pressures are lower than 1 torr.

Figure 10:
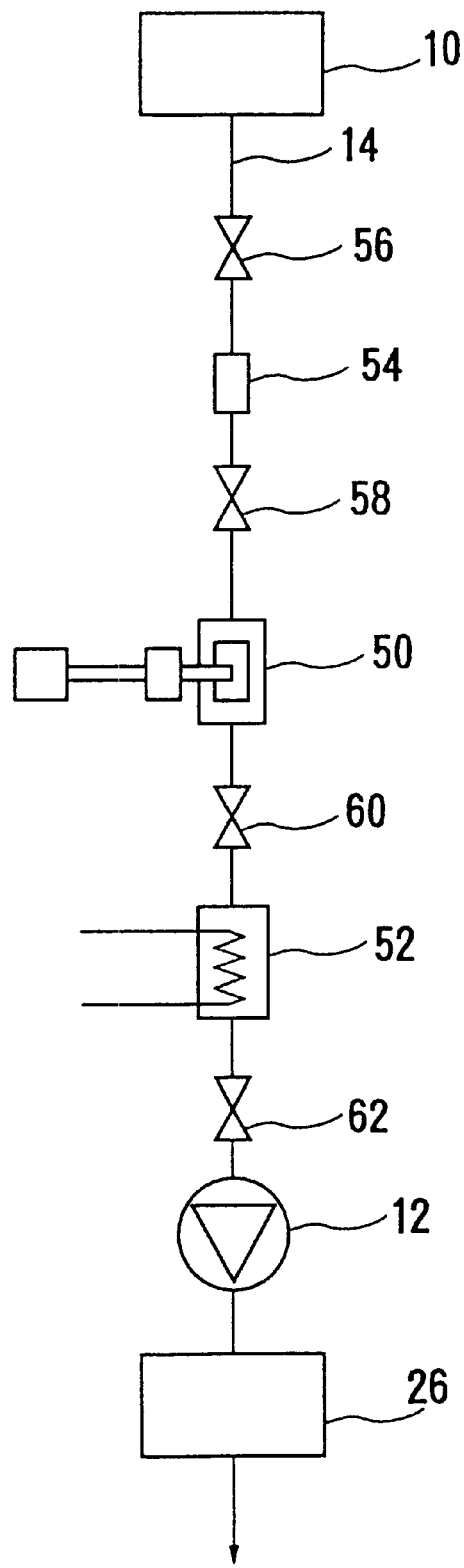
FIG. 10 is a schematic representation of an embodiment which combines thermal and reactive traps in the evacuation system.

FIG. 10 shows another type of trap configuration based on a combination of thermal and reactive types. The conduit 14 connecting the vacuum chamber 10 and the vacuum pump 12 is provided with two thermal trapping devices 50, 52 at different temperatures, and a casing 54 provided in the fore-stage of trapping device 50 contains a "sacrificial" material. The sacrificial material is a specific one, that shows a high reactivity with a target components in the exhaust gas, for example, carbon or metals in a powered form. The reactants formed with the target and specific sacrificial material have in general a higher melting temperature than the target material itself, allowing it to be trapped at a relatively higher temperatures, making it possible to treat it on the higher-temperature-range trapping devices. The selection of the sacrificial material to be used depends on the target material and/or the overall trap design.

Figure 11:
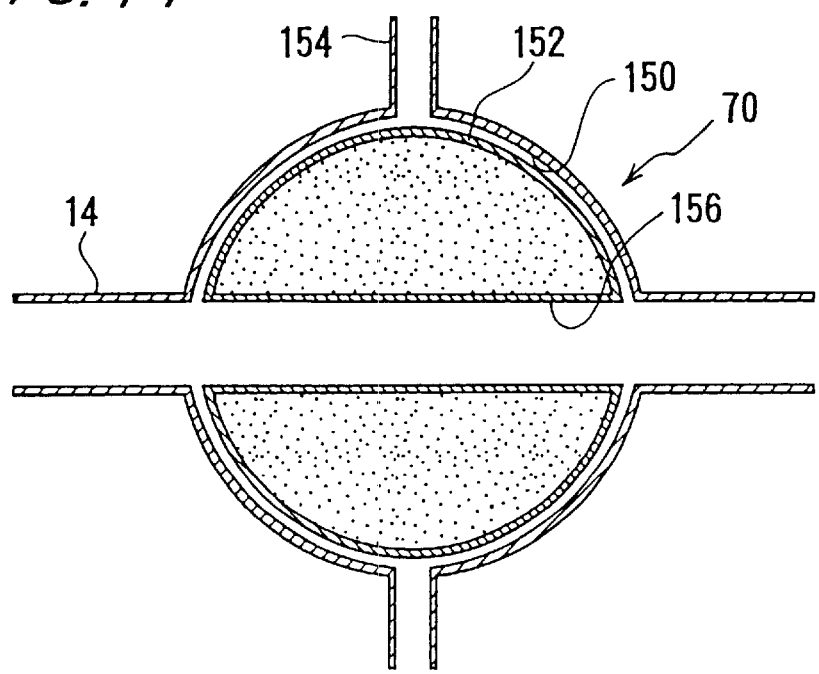
FIG. 11 is a schematic representation of a spherical reactive trap arrangement.

FIG. 11 shows the construction of a spherical shaped trap 70, provided in the path of the evacuation conduit 14, comprising a rotatable spherical bulb (trapping member) 152 arranged in a spherical space 150. The spherical space 150 is communicated orthogonally with a regeneration conduit 154, and also includes an internal passage 156 having the same inner diameter as that of the evacuation conduit 14. During the trapping duty, the trapping device 70 is in the first position where the internal passage 156 communicates with the evacuation conduit 14, as shown in FIG. 11, to serve its trapping function by having its internal surface of the spherical space 150 cooled to a particular temperature to trap a certain component. Preparing for the regeneration duty, the spherical bulb is rotated 90 degrees to communicate the internal passage 156 with the regeneration conduit 154. The trapping device 70 can be regenerated by flowing an inert gas at elevated temperatures.

Figure 12:
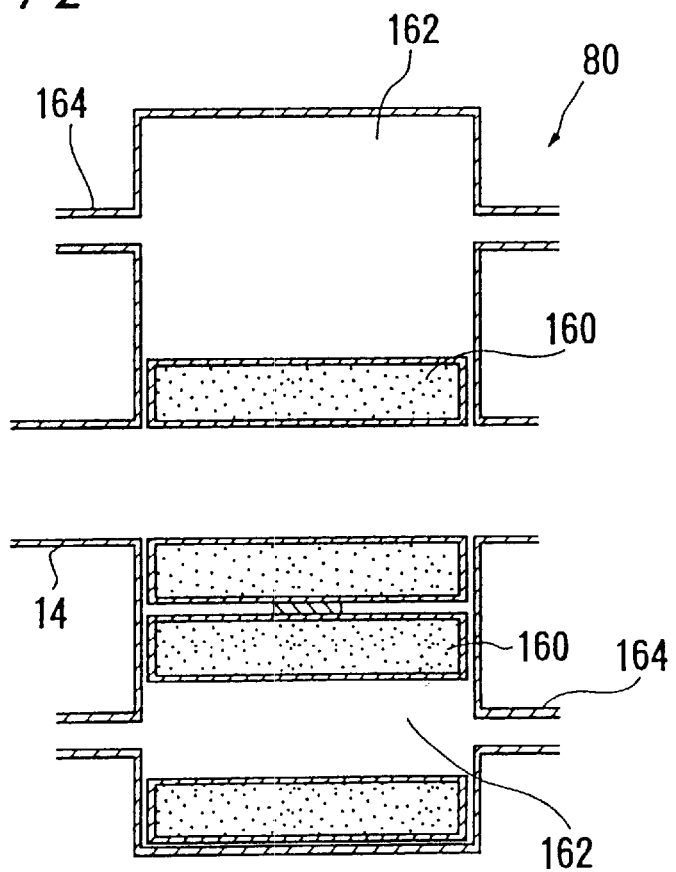
FIG. 12 is a schematic representation of a dual parallel trap arrangement.

FIG. 12 shows a switchable type trapping device 80 having two cylindrical trapping members 160. The evacuation conduit 14 is provided with opposing standby spaces 162 which communicate with their own regeneration pathway 164. When one of the cylindrical trapping members 160 has reached its trapping capacity, this trapping member is transposed laterally to be switched with a fresh trapping member 160. The used trapping member 160 discharges its content into the regeneration pathway 164 to the regeneration apparatus. This swapping process can be repeated successively while the exhausting process is continued uninterrupted.

Figure 13:
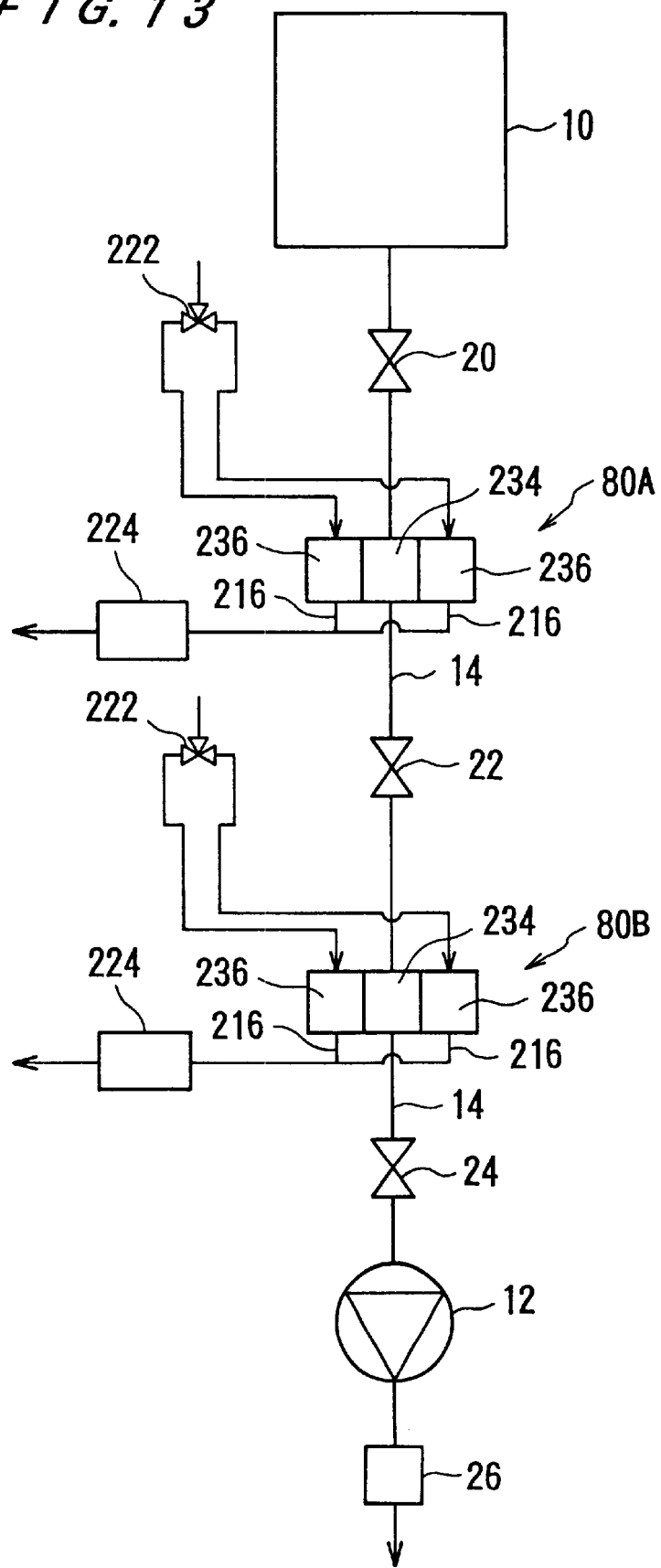
FIG. 13 is a schematic representation of another embodiment of the evacuation system according to the present invention.
Figure 14:
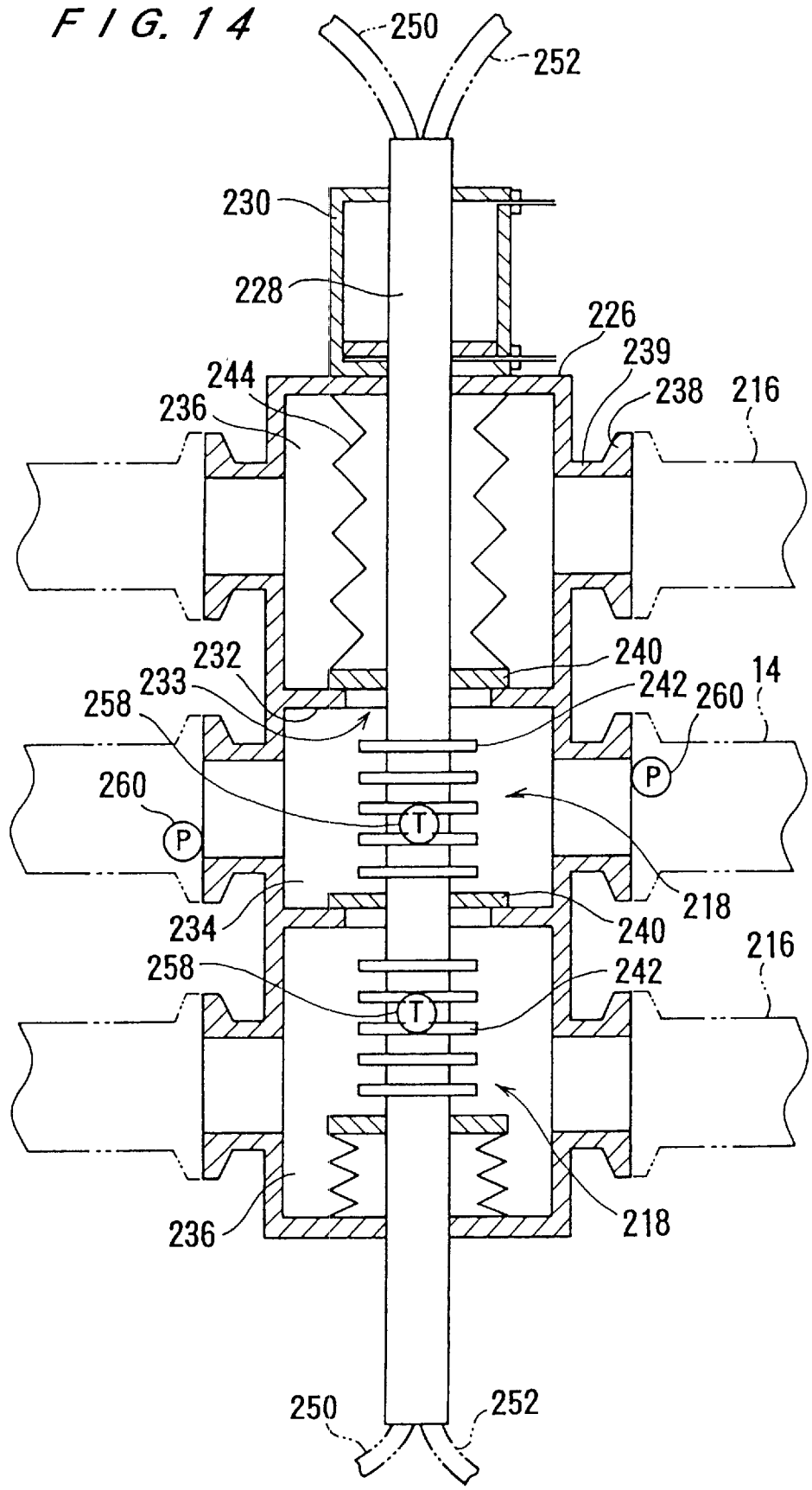
FIG. 14 is a drawing to show the construction of a thermal trap used in the embodiment shown in FIG. 13.

FIGS. 13 to 15 show other embodiments of the switchable trapping devices comprising two regeneration pathways 216 adjacent and parallel to the exhaust conduit 14 of the vacuum pump 12 for evacuating the vacuum chamber, and two trapping members 218 provided are able to be switched by crossing the exhaust conduit 14 and the regeneration pathways 216 linearly in a crossing direction or the direction at right angles to the regeneration pathways 216.

This switchable type trapping devices is comprised by a three dimensional rectangular casing 226 which straddles the exhaust gas conduit 14 and the regeneration pathways 216, a shaft member 228 and an air cylinder 230 which is a driving device for reciprocating the shaft member 228 (refer to FIG. 15) along the crossing direction. The casing 226 is divided into three chambers, a trap chamber 234 at the center and two regeneration chambers 236 at both ends, with dividing walls 232, and each chamber is provided with a pipe section 239 having a flange 238 to connect to the exhaust conduit 14 or to the regeneration pathways 216.

Each regeneration pathway 216 is supplied with a regeneration gas from a regeneration gas source (not shown) through a three-way valve 222 for heating and vaporizing the precipitated products on the trapping member 218 in the regeneration chamber 236 and carrying the vaporized gas therefrom. In a downstream of the regeneration chamber 236 in the regeneration pathway 216 is provided an exhaust gas treatment device 224. In the figure, there are separate exhaust gas treatment devices 224, but it is possible to share one shared between the two trapping devices.

The shaft member 228 is provided with three equally spaced dividing plates 240, and between the plates are a plurality of baffle plates 242 which are made integral with the shaft member 228 (e.g. by welding) to promote thermal conduction. The dividing walls 232 of the casing 226 are provided with a central opening section 233, and the size of this opening is chosen so that the baffle plates 242 can pass through but not the dividing plates 240. In the interior spaces between the end dividing plates 240 and the end walls of the casing 226 are covered with bellows 244 (refer to FIG. 14) to maintain hermetic conditions between the regeneration pathway 216 and the exterior environment. Those regions which the dividing plates 240 of the dividing walls 232 are touching are provided with O-rings (not shown) to maintain hermetic condition between the trap chamber 234 and the regeneration chambers 236. The dividing plates 240 are made of a material having high thermal insulation properties to prevent thermal transfer between the trap chamber 234 and the regeneration chambers 236.

Figures 15A, 15B:
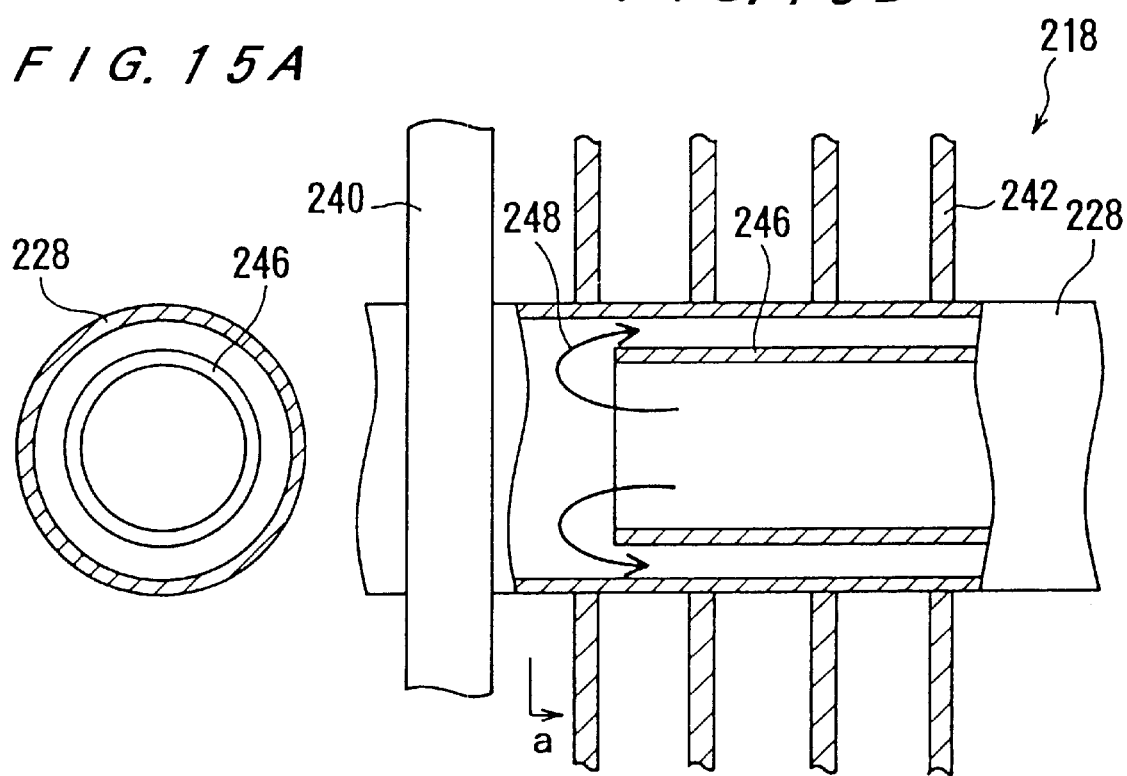
FIGS. 15A and 15B are enlarged views showing the construction of a thermal trap shown in FIG. 14.

The shaft member 228, as shown in FIG. 15A, is in the form of a cylinder and is made of a material of good thermal conductivity such as metals, and its interior space is sealed off by means of the central dividing plate 240. As shown in FIG. 15B, the shaft member 228 is made in such a way that an inner tube 246 is inserted from both ends towards the vicinity of the center dividing plate 240 so that the thermal medium flowing in the inside of the inner tube 246 is returned, at the left end in the drawing, to flow through a thermal medium passage 248 between the shaft member 228 and the inner tube 246.

The thermal medium passage 248 can be supplied with cooling medium such as liquid nitrogen or cooled air or water, through a cooling medium supply hose 250 and discharged through a discharge hose 252 which are, respectively, connected to both ends of the shaft member 228. Of the two thermal medium passages 248 at both ends of the shaft member 228, the cooling medium flows through only the one with the baffle 242 staying in the trap chamber 234, and the side that stays in the trap chamber 236 is either not supplied with the cooling medium or the heating medium flows therethrough. In this case, the hoses 250, 252 are connected to the ends which pass through the air cylinder 230, so that less space is needed compared with the case of connecting to the space between the air cylinder 230 and the casing 226.

The piston of the air cylinder 230 is made to move forward or backward by the air passing through the solenoid valve performing shutting and opening actions according to magnetic signals supplied to the valve. The control over the valve are operated, for example, by signals supplied from a sequencer or relay so that switching action may be carried out periodically or according to signals from pressure sensors. Other sensors to detect temperatures and pressures may be used, for example, a temperature sensor near the baffle 242 in the trapping member 218 or a pressure sensor 260 at fore and aft of the trapping member 218 in the exhaust conduit 14.

Next, the operation of the switchable type trapping devices described above will be presented. Referring to FIG. 14, the cooling medium (liquid nitrogen, cooled air or water) is flowed through the trapping member 218 in the trap chamber 234 through the supply hose 250 and the thermal medium passage 248, so that the baffles 242 through the shaft member 228 can be cooled. Therefore, certain components of the process gas in the exhaust gas which come into contact are precipitated and form a deposit on the surface of the trapping member. In the regeneration chambers 236, the temperatures of the shaft member 228 and the baffle plates 242 are raised by a high temperature gas or a regeneration gas flowing through the thermal medium passage 248, and the precipitated products are again vaporized. The vaporized gas is exhausted from the regeneration pathways 216, and is processed in the exhaust gas treatment device 224 after detoxification step to be released or recirculated or stored for reuse.

After certain period of operation of the trap, the air cylinder 230 is operated and the trapping member 218 which was in the trap chamber 234 is replaced with another trapping member 218 in one of the regeneration chambers 236, thus performing the respective trapping or regeneration step. Because of the thermal insulation of the dividing plate 240 provided between the trap chamber 234 and the regeneration chamber 236, there is no loss of thermal energy and the trapping and regeneration processes can be carried out efficiently. The regeneration chamber 236 and the air cylinder 230 are hermetically separated by the bellows 244, therefore, a drop in the process efficiency caused by thermal exchanges with the external environment can be prevented so that the trapping device can be operated in a stable condition, and possible contamination into the exhaust conduit 14 from external sources can also be prevented.

In the embodiments above, the trapping member 218 moves through the casing 226 linearly to perform the switching operation, however, it is equally effective to arrange the casing in a ring form so that the trapping members can be revolved into an operating position. In case of a rotary arrangement having two trapping members, only one regeneration pathway would be sufficient. Further, in such an arrangement, it is possible to have not less than three trapping member 218 for a given exhaust conduit so that the exhaust gas can be treated simultaneously in two regeneration pathways 216. Usually, the rate of regeneration is slower than that of trapping, this type of rotary arrangement is advantageous.

Figure 16:
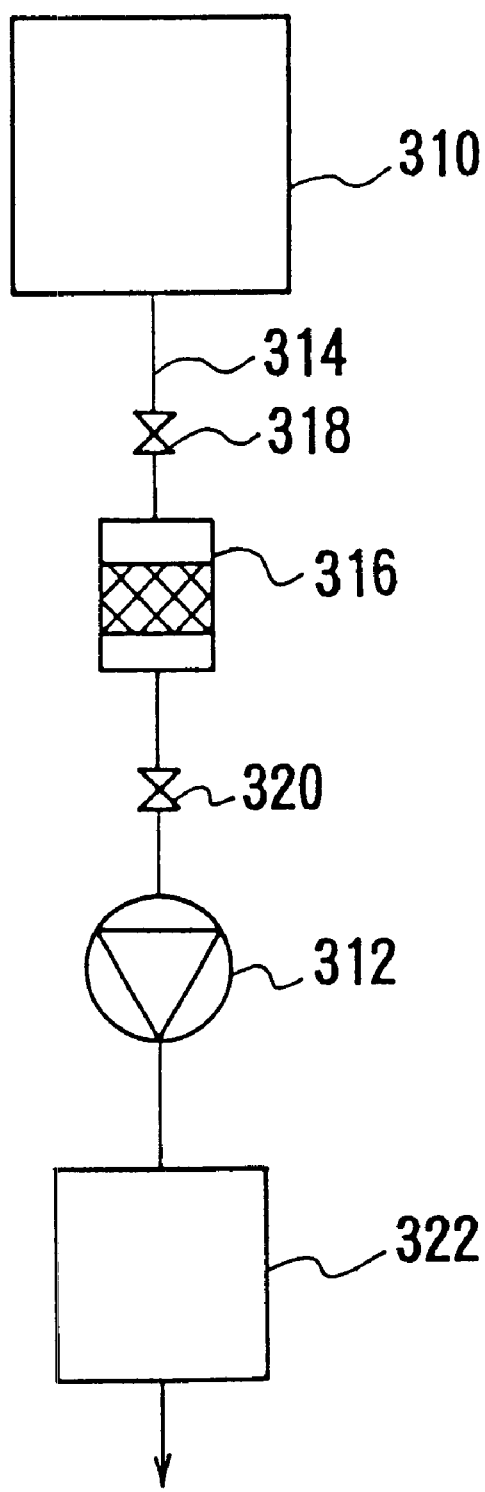
FIG. 16 is a schematic representation of another embodiment of reactive trap arrangement in the evacuation system.

FIG. 16 shows another embodiment in which a reactive trapping device 316 is provided in the evacuation conduit 314 connecting the vacuum chamber 310 with the vacuum pump 312 through valves 318, 320. There is an exhaust gas treatment device 322 downstream of the vacuum pump 312.

Figure 17:
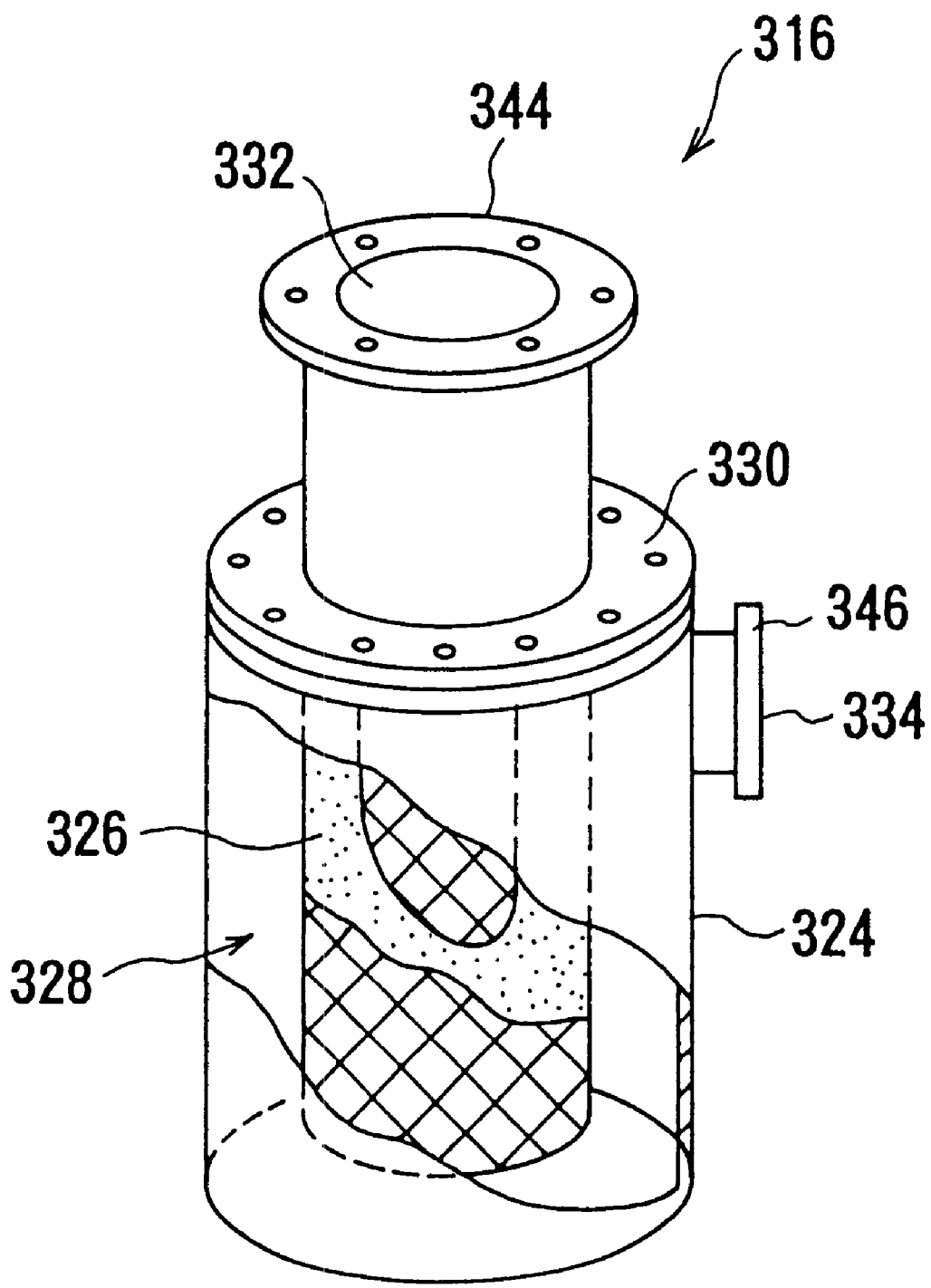
FIG. 17 is a perspective view of the essential structural components of a reactive trap.

The reactive trapping device 316 comprises, as shown in FIG. 17, a cylindrical casing 324 containing a sacrificial material 326 in the interior space of a container 328, a ceiling plate 330 having an inlet port 332, and an outlet port 334 on the outer surface of the casing 324. The container 328 comprises, as shown in FIG. 18A, two gas-permeable mesh cylinders 336, 338, a top plate 340, and an overall bottom plate 342 to seal off the overall bottom of the container 328.

The sacrificial material 326 should also be permeable, and can be made as bulk material of particulate, powders, aciculate, irregular lumps or fibers, or a sintered material. The material for making the sacrificial material is selected from one that has a high reactivity with the target component in the exhaust gas, considering its stability and ease of fabrication. Those components which present problems in semiconductor device manufacturing often contain fluorine gas, and in such cases, C, Si, S or a mixture thereof can be used. The material used in constructing vacuum pump or other material having similar properties are also useful as sacrificial materials.

The inlet port 332 and the outlet port 334 are provided with their own flanges 344, 346 for connecting to the exhaust conduit 314, and the interior space of the container 328 is communicated with the inlet port 332 which are connected to the vacuum chamber 310 through the valve 318. The exterior space of the container 328, that is, the interior space of the casing 324, is communicated with the outlet port 334, which are connected to the vacuum pump 312 through the valve 320. The ceiling plate 330 of the casing 324 is detachable from the trapping device 316 to permit refill or exchange of the sacrificial material 326 as well as cleaning of the interior of the casing 324.

FIGS. 18B and 18C show other examples of the containers for housing the sacrificial material. FIG. 18B shows a type with a shorter inner mesh cylinder 338 and the bottom sections 348, 350 are also made of a mesh material, so as to increase the reaction area of the container 328 and its reaction efficiency while preventing an excessive pressure loss. FIG. 18C shows a type in which the top portion of the outer cylinder 336 is made as an impermeable portion 352, and only the bottom portion is made of a mesh material so that the gas will flow through the bottom portion only. This arrangement is effective when the sacrificial material disappears through the reaction with the exhaust gas so that the sacrificial material disposed in the top portion can be gradually lowered into the bottom portion to continue the reaction.

Figure 19:
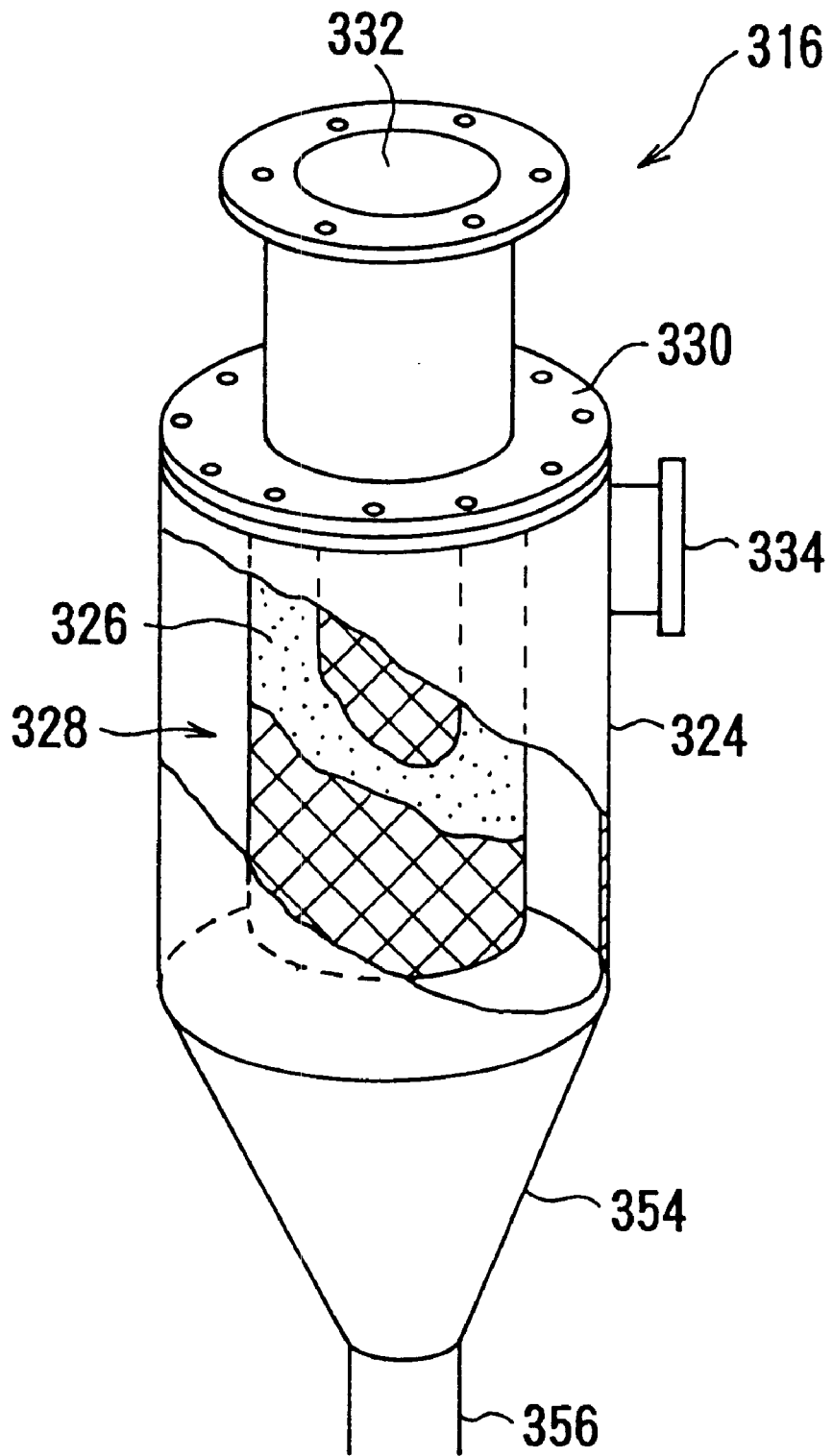
FIG. 19 is another embodiment of the reactive trap having a filter section.

FIG. 19 shows another embodiment in which the bottom portion of the casing 324 has a tapered section 354. This is useful when a trapping reaction between the sacrificial material 326 and the exhaust gas produces solid particles. The particles may be dropped into the tapered section 354 to be discharged from the discharge port 356 provided at the bottom of the tapered section 354. In this case, it is desirable to utilize the gravity flow of the exhaust gas, therefore, it is advantageous to adopt the type of outer cylinder 336 shown in FIG. 18C.

FIG. 20A shows another type of reactive trapping device in which a cylindrical casing 360 contains a permeable sacrificial material plate 362. The sacrificial material plate 362 can be made as a laminated mesh sheets or by sintering powders, particulates or aciculates, or a plate formed with fine holes therein, to suit each application. FIG. 20B shows another type in which the gas flow spaces 364 are provided between impermeable or permeable sacrificial material plates 362, and this configuration is particularly suitable when it is difficult to fabricate the permeable sacrificial material plate.

Figure 21:
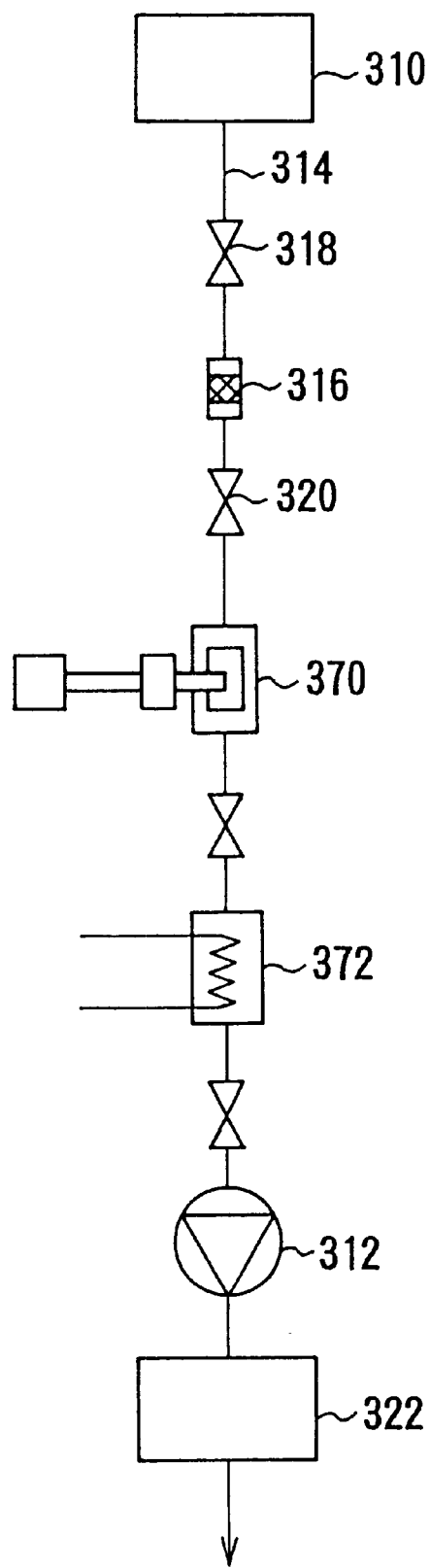
FIG. 21 is a schematic representation of yet another combination of thermal and reactive traps in the evacuation system.

FIG. 21 shows another embodiment of the evacuation system in which thermal trapping devices 370, 372 are provided in a downstream location of the system shown in FIG. 16. This arrangement is used to eliminate residual components from exhaust gas which had not reacted with the sacrificial material and/or to eliminate their reaction products so that they can be trapped before reaching the vacuum pump 312. In this example, two trapping devices operating at two different temperatures are shown, and this arrangement is convenient in separately trapping and regenerating gaseous elements which have different solidifying temperatures.

Figure 22:
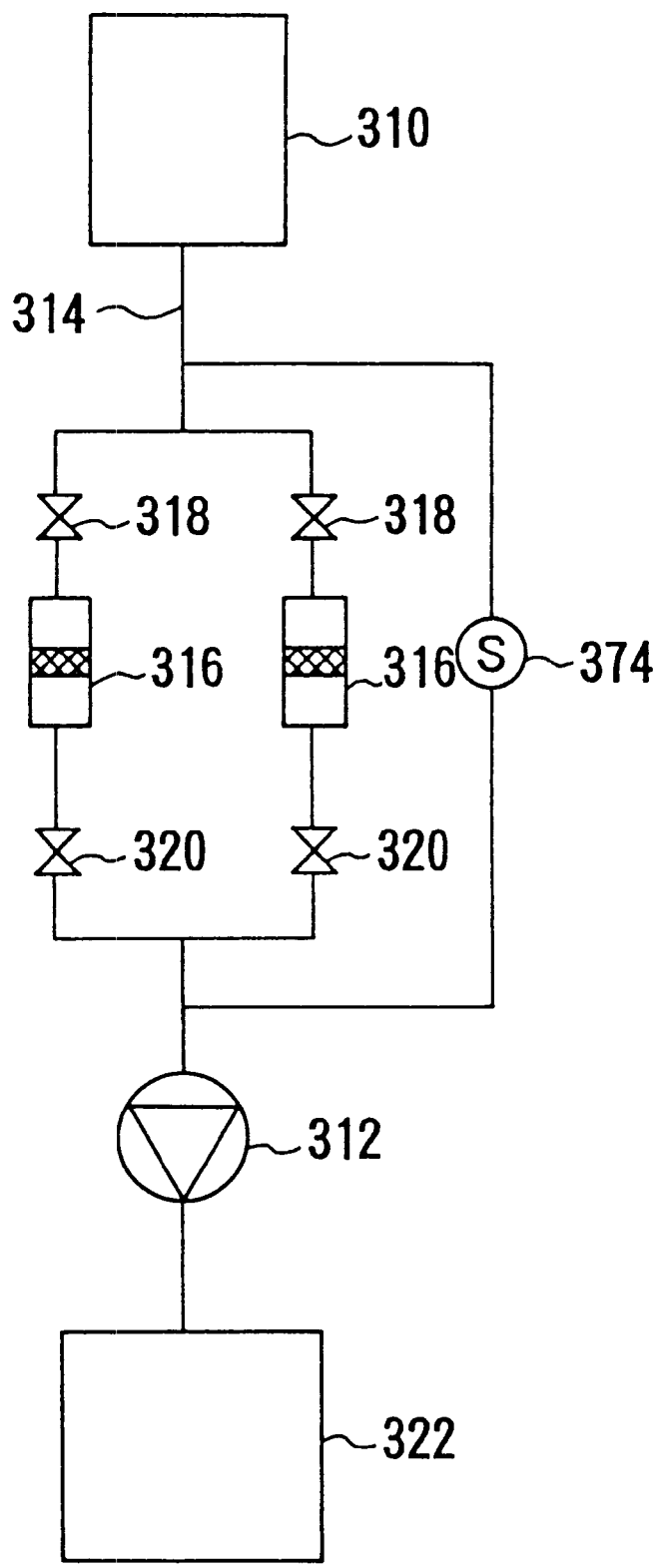
FIG. 22 is a schematic representation of a double parallel arrangement of reactive traps in combination with a differential pressure sensor in the evacuation system.
Figure 23:
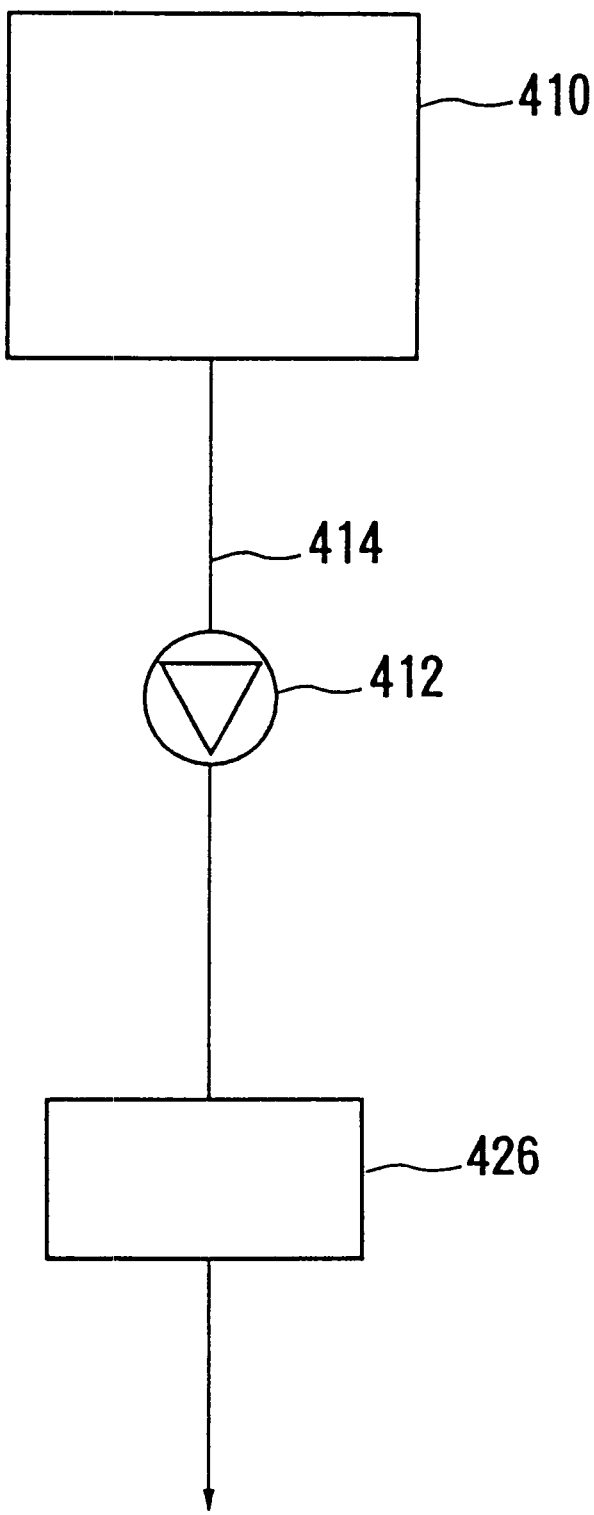
FIG. 23 is a schematic representation of the conventional evacuation system.

FIG. 22 shows another embodiment of the evacuation system in which two groups of reactive trapping devices 316 having own valves 318, 320 are provided to facilitate exchanging the trapping devices or sacrificial material without stopping the evacuation line. Also, in this example, a differential pressure sensor 374 is provided in the fore- and aft-locations of trapping device 316 so that the rate of loss of the sacrificial material or the degree of obstruction in the line can be estimated from the signal from the differential pressure sensor 374.

What is claimed is:

1. An evacuation system comprising:
   a processing chamber;
   a vacuum pump; and
   an evacuation conduit communicating said processing chamber and said vacuum pump to evacuate said processing chamber, said evacuation conduit being provided with a first trapping device and a second trapping device arranged in series in a direction from said processing chamber to said vacuum pump, said first trapping device operating at a higher temperature and said second trapping device operating at a lower temperature, both cooperating for capturing components contained in an exhaust gas discharged from said processing chamber,
   wherein at least one of said first trapping device and said second trapping device is cooled by vaporization heat of liquified gas
   wherein at least either of said first or second trapping device has an inlet port for admitting a regeneration gas and an outlet port for releasing a regenerated gas other than an entry port and an exit port connected to said evacuation conduit.

2. A system according to claim 1, wherein said processing chamber is a semiconductor processing chamber.

3. A system according to claim 1, wherein said low-temperature trapping device is cooled with a helium refrigeration unit.

4. A system according to claim 1, wherein said first trapping device or said second trapping device is cooled with a pulse tube refrigeration unit.

5. A system according to claim 1, wherein said first trapping device or said second trapping device is cooled by liquid nitrogen.

6. A system according to claim 1, wherein at least either of said first or second trapping device is detachably attached through a coupling to said evacuation conduit.

7. A system according to claim 1, wherein at least either of said first or second trapping device is provided with a heater.

8. A system according to claim 1, wherein at least either of said first or second trapping device has an inlet port for admitting a regeneration gas.

9. A system according to claim 1, wherein at least either of said first or second trapping device has an outlet port for releasing a regenerated gas.

10. A system according to claim 1, wherein at least either of said first or second trapping device comprises two or more trapping units arranged in a parallel arrangement, which is communicable selectively with said evacuation conduit.

11. A system according to claim 1, wherein at least either of said first or second trapping device is provided with a differential pressure sensor.

12. A system according to claim 1, wherein at least either of said first or second trapping device is provided with a recovery conduit for returning a regenerated gas to a processing chamber.

13. A system according to claim 1, wherein at least either of said first or second trapping device is provided with a conduit to deliver a regenerated gas to a detoxification apparatus.

14. A system according to claim 1, wherein at least either of said first or second trapping device is provided with a conduit to deliver a regenerated gas to a low temperature tank held at a temperature close to a temperature of said either of said first or second trapping device.

15. A system according to claim 1, wherein said evacuation conduit comprises two or more passages arranged in a parallel arrangement in such a way to be selectively communicable.

16. A system according to claim 1, further comprising a regeneration conduit for regenerating at least either of said first or second trapping device, said either of said first or second trapping device being disposed so as to be switchable between said evacuation conduit and said regeneration conduit.

17. A system according to claim 16, wherein said regeneration conduit is disposed adjacent said evacuation conduit and said either of said first or second trapping device comprises a switching device for mechanically switching said either of said first or second trapping device between said regeneration conduit and said evacuation conduit.

18. A system according to claim 16, wherein said either of said first or second trapping device comprises two trapping members alternatingly placed in said regeneration conduit and said evacuation conduit.

19. A system according to claim 16, further comprising a control device for automatically operating said switching device by directly or indirectly judging the amount of components trapped in said trapping device.

20. A system according to claim 1, wherein said vacuum pump is a dry pump using no lubricant in an exhaustion passage within said vacuum pump.

21. An evacuation system comprising:

a processing chamber:

a vacuum pump; and an evacuation conduit communicating said processing chamber and said vacuum pump to evacuate said processing chamber, said evacuation conduit being provided with a first trapping device and a second trapping device arranged in series in a direction from said processing chamber to said vacuum pump, said first trapping device operating at a higher temperature and said second trapping device operating at a lower temperature, both cooperating for capturing components contained in an exhaust gas discharged from said processing chamber;

wherein at least one of said first trapping device and said second trapping device is cooled by vaporization heat of liquified gas, wherein said first trapping device or said second trapping device is provided with not less than two trapping devices, one of which is cooled with a helium refrigeration unit and another cooled with liquid nitrogen.

22. A system according to claim 21, wherein said processing chamber is a semiconductor processing chamber.

23. A system according to claim 21, wherein said vacuum pump is a dry pump using no lubricant in an exhaustion passage within said vacuum pump.

24. A system according to claim 21, wherein said first trapping device or said second trapping device is cooled with a pulse tube refrigeration unit.

25. A system according to claim 21, wherein at least either of said first or second trapping device is detachably attached through a coupling to said evacuation conduit.

26. A system according to claim 21, wherein at least either of said first or second trapping device is provided with a heater.

27. A system according to claim 21, wherein at least either of said first or second trapping device has an inlet port for admitting a regeneration gas.

28. A system according to claim 21, wherein at least either of said first or second trapping device has an outlet port for releasing a regenerated gas.

29. A system according to claim 21, wherein at least either of said first or second trapping device comprises two or more trapping units arranged in a dual parallel arrangement, which is communicable selectively with said evacuation conduit.

30. A system according to claim 21, wherein at least either of said first or second trapping device is provided with a differential pressure sensor.

31. A system according to claim 21, wherein at least either of said first or second trapping device is provided with a recovery conduit for returning a regenerated gas to a processing chamber.

32. A system according to claim 21, wherein at least either of said first or second trapping device is provided with a conduit to deliver a regenerated gas to a detoxification apparatus.

33. A system according to claim 21, wherein at least either of said first or second trapping device is provided with a conduit to deliver a regenerated gas to a low temperature tank held at a temperature close to a temperature of said either of said first or second trapping device.

34. A system according to claim 21, wherein at least either of said first or second trapping device comprises two or more trapping units arranged in a parallel arrangement, said trapping units selectively communicable with said evacuation conduit.

35. A system according to claim 21, wherein said evacuation conduit is arranged in a dual parallel arrangement in such a way to be selectively communicable.

36. A system according to claim 34, wherein said regeneration conduit is disposed adjacent said evacuation conduit and said either of said first or second trapping device comprises a switching device for mechanically switching said either of said first or second trapping device between said regeneration conduit and said evacuation conduit.

37. A system according to claim 34, wherein said either of said first or second trapping device comprises two trapping members alternatingly placed in said regeneration conduit and said evacuation conduit.

38. A system according to claim 21, further comprising a regeneration conduit for regenerating at least either of said first or second trapping device, said either of said first or second trapping device being disposed so as to be switchable between said evacuation conduit and said regeneration conduit.

* * * * *